United States Patent
Kultran et al.

(10) Patent No.: US 11,616,481 B2
(45) Date of Patent: *Mar. 28, 2023

(54) SYSTEMS AND METHODS FOR MODULAR POWER AMPLIFIERS

(71) Applicant: EPIRUS, INC., Hawthorne, CA (US)

(72) Inventors: Denpol Kultran, Torrance, CA (US); Yiu Man So, Hawthorne, CA (US); Albert Montemuro, Redondo Beach, CA (US); Jacob Zinn Echoff, Redondo Beach, CA (US); Michelle Marasigan, Los Angeles, CA (US); Michael John Hiatt, El Segundo, CA (US); Jason Reis Chaves, Redondo Beach, CA (US); Michael Alex Borisov, Long Beach, CA (US); Jar Jueh Lee, Irvine, CA (US); Harry Bourne Marr, Jr., Manhattan Beach, CA (US); Scott William Buetow, Los Angeles, CA (US)

(73) Assignee: Epirus, Inc., Hawthorne, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/748,341

(22) Filed: May 19, 2022

(65) Prior Publication Data

US 2022/0286097 A1    Sep. 8, 2022

Related U.S. Application Data

(63) Continuation of application No. 17/354,971, filed on Jun. 22, 2021, which is a continuation-in-part of application No. 16/908,476, filed on Jun. 22, 2020.

(51) Int. Cl.
H03F 1/02     (2006.01)
H03F 3/24     (2006.01)
(Continued)

(52) U.S. Cl.
CPC ............. *H03F 3/245* (2013.01); *H03F 3/195* (2013.01); *H03F 3/602* (2013.01); *H03F 2200/451* (2013.01)

(58) Field of Classification Search
CPC .................................... H03F 1/02; H03F 1/07
(Continued)

(56) References Cited

U.S. PATENT DOCUMENTS

| | | |
|---|---|---|
| 3,562,741 A | 2/1971 | McEvoy et al. |
| 4,430,577 A | 2/1984 | Bouquet |

(Continued)

FOREIGN PATENT DOCUMENTS

WO    WO 2018/187245    10/2018

OTHER PUBLICATIONS

Patent Cooperation Treaty, International Search Report and Written Opinion issued in PCT/US2021/038529, dated Nov. 10, 2021, pp. 1-12.

(Continued)

*Primary Examiner* — Henry Choe
(74) *Attorney, Agent, or Firm* — Knobbe, Martens, Olson & Bear, LLP

(57) ABSTRACT

Systems and apparatuses are disclosed that include an RF generator configured to generate RF signals having a wavelength. Amplifiers are configured to receive and amplify the RF signals from the RF generator and are separated from each other by a separation distance in a range between about 0.2 times the wavelength and about 10.0 times the wavelength. A power management system is configured to control one or more of the amplifiers based on information received that is associated with the RF signals.

22 Claims, 23 Drawing Sheets

(51) Int. Cl.
*H03F 3/60* (2006.01)
*H03F 3/195* (2006.01)

(58) Field of Classification Search
USPC .............................................. 330/124 R, 295
See application file for complete search history.

(56) References Cited

U.S. PATENT DOCUMENTS

| | | | |
|---|---|---|---|
| 5,164,689 A | 11/1992 | Plonka | |
| 5,426,641 A | 6/1995 | Afrashteh et al. | |
| 5,880,648 A | 3/1999 | Aves et al. | |
| 6,362,449 B1 | 3/2002 | Hadidi et al. | |
| 6,756,843 B2 * | 6/2004 | Charley | H04B 1/406 330/129 |
| 7,242,518 B1 | 7/2007 | Lynch et al. | |
| 7,256,650 B1 | 8/2007 | Stockert | |
| 7,388,433 B1 | 6/2008 | Hecht | |
| 7,479,691 B2 | 1/2009 | Ewe et al. | |
| 7,508,338 B2 | 3/2009 | Pluymers et al. | |
| 7,603,088 B2 * | 10/2009 | Ammar | G01K 11/006 455/67.11 |
| 7,948,318 B2 | 5/2011 | Hongo | |
| 8,712,344 B2 | 4/2014 | Wang et al. | |
| 8,718,580 B2 | 5/2014 | Borodulin et al. | |
| 8,737,527 B2 | 5/2014 | Lozhkin | |
| 8,737,531 B2 | 5/2014 | Saunders | |
| 8,760,634 B2 | 6/2014 | Rose | |
| 9,065,163 B1 | 6/2015 | Wu et al. | |
| 9,111,949 B2 | 8/2015 | Yu et al. | |
| 9,455,695 B2 | 9/2016 | Kull et al. | |
| 9,518,554 B2 | 12/2016 | Mongin et al. | |
| 9,548,880 B2 | 1/2017 | Hori | |
| 9,825,593 B2 | 11/2017 | De Vreede et al. | |
| 9,984,996 B2 | 5/2018 | Lu et al. | |
| 10,224,184 B2 | 3/2019 | Van Zyl | |
| 10,289,184 B2 | 5/2019 | Malik et al. | |
| 10,304,669 B1 | 5/2019 | Coumou et al. | |
| 10,355,770 B2 * | 7/2019 | Gharavi | H04B 7/1555 |
| 10,705,556 B2 | 7/2020 | Kapur et al. | |
| 10,791,015 B2 * | 9/2020 | Mochizuki | H04B 7/0452 |
| 10,938,347 B2 | 3/2021 | Rofougaran et al. | |
| 10,958,323 B1 | 3/2021 | Ben-Yishay et al. | |
| 11,005,514 B2 | 5/2021 | Cordier | |
| 11,012,120 B2 | 5/2021 | Guillot et al. | |
| 11,094,507 B2 | 8/2021 | Funk et al. | |
| 11,158,942 B1 | 10/2021 | Scott et al. | |
| 11,211,703 B2 | 12/2021 | Marr, Jr. et al. | |
| 11,283,305 B2 * | 3/2022 | Adachi | H03G 3/3042 |
| 11,469,722 B2 | 10/2022 | Kultran et al. | |
| 11,522,286 B2 | 12/2022 | Marr, Jr. et al. | |
| 2003/0227330 A1 | 12/2003 | Khanifar et al. | |
| 2006/0049870 A1 | 3/2006 | Hellberg | |
| 2008/0153435 A1 | 6/2008 | Hirano et al. | |
| 2008/0297414 A1 | 12/2008 | Krishnaswamy et al. | |
| 2010/0237884 A1 | 9/2010 | Bult et al. | |
| 2011/0054271 A1 | 3/2011 | Derchak et al. | |
| 2011/0109501 A1 | 5/2011 | Corman | |
| 2011/0156813 A1 * | 6/2011 | Kim | H03F 1/0272 330/124 R |
| 2012/0200281 A1 | 8/2012 | Herbsommer et al. | |
| 2013/0120190 A1 | 5/2013 | McCune, Jr. | |
| 2014/0266460 A1 | 9/2014 | Nobbe et al. | |
| 2015/0061769 A1 | 3/2015 | Bodnar | |
| 2015/0270806 A1 | 9/2015 | Wagh et al. | |
| 2016/0036113 A1 | 2/2016 | Wu et al. | |
| 2016/0049909 A1 | 2/2016 | Scherrer | |
| 2016/0127060 A1 | 5/2016 | Cross | |
| 2016/0282450 A1 | 9/2016 | Kishigami et al. | |
| 2017/0180011 A1 | 6/2017 | Charvat et al. | |
| 2017/0261597 A1 | 9/2017 | Wada | |
| 2017/0359033 A1 | 12/2017 | Bazzani | |
| 2018/0026586 A1 | 1/2018 | Carbone | |
| 2018/0131102 A1 | 5/2018 | Wang | |
| 2019/0058448 A1 | 2/2019 | Seebacher | |
| 2020/0036334 A1 | 1/2020 | Witt et al. | |
| 2020/0054271 A1 | 2/2020 | Zerial et al. | |
| 2020/0395894 A1 | 12/2020 | Esmael | |
| 2021/0057813 A1 | 2/2021 | So et al. | |
| 2021/0399695 A1 | 12/2021 | Kultran et al. | |
| 2021/0399700 A1 | 12/2021 | Kultran et al. | |
| 2022/0045423 A1 | 2/2022 | Scott et al. | |
| 2022/0115782 A1 | 4/2022 | Marr, Jr. et al. | |
| 2022/0158346 A1 | 5/2022 | Marr, Jr. et al. | |
| 2022/0271569 A1 | 8/2022 | Marr, Jr. et al. | |
| 2022/0286097 A1 | 9/2022 | Kultran et al. | |

OTHER PUBLICATIONS

Patent Cooperation Treaty, International Search Report issued in PCT/US2020/021895, dated Jun. 9, 2020, pp. 1-2.
Manh et al., "An Independently Biased 3-stack GaN HEMT Configuration for 5G Mobile Networks", 2019 26th International Conference on Telecommunications (ICT), 2019, pp. 1-5, doi: 10.1109/ICT.2019.8798858.
Ampleon, "AN11226 TTL bias switching", Application note, Rev. 2, Sep. 1, 2015, pp. 1-13, The Netherlands B.V.
Barsegyan et al., "Bias Sequencing and Gate Pulsing Circuit for GaN Amplifier", 10th International Radar Symposium India, 2015, pp. 1-5, NIMHANS Convention Centre, Bangalore INDIA.
Wang et al., "60% Efficient 10-GHz Power Amplifier With Dynamic Drain Bias Control", IEEE Transactions On Microwave Theory and Techniques, Mar. 2004, pp. 1-5, vol. 52(3).
Sheppard et al., "High-Power Microwave GaN/AlGaN HEMT's on Semi-Insulating Silicon Carbide Substrates", IEEE Electron Device Letters, Apr. 1999, pp. 161-163, vol. 20(4).
Korovin et al., "Pulsed Power-Driven High-Power Microwave Sources", Proceedings of the IEEE, Jul. 2004, pp. 1082-1095, vol. 92(7).
Delos et al., "Unique Gate Drive Applications Enable Rapidly Switching On/Off for Your High Power Amplifier", Analog Dialogue 51-12, Dec. 2017, pp. 1-4.
Gold et al., "Review of high-power microwave source research", Review of Scientific Instruments 68, 1997, pp. 1-31, 68, 3945, https://doi.org/10.1063/1.1148382.
Schaler et al., "X-Band MMIC GaN Power Amplifiers Designed for High-Efficiency Supply-Modulated Transmitters", IEEE Xplore, 2013 IEEE MTT-S International Microwave Symposium Digest (MTT), Jun. 2-7, 2013, pp. 1-3.
Pajic et al., "X-Band Two-Stage High-Efficiency Switched-Mode Power Amplifiers", IEEE Transactions On Microwave Theory and Techniques, Sep. 2005, vol. 52(9).
Patent Cooperation Treaty, International Search Report and Written Opinion issued in PCT/US2021/038529, Nov. 10, 2021, pp. 1-12.
Extended European Search Report issued in EP 20769078.5 dated Oct. 31, 2022.
International Search Report and Written Opinion issued in PCT/US2022/014615, dated Apr. 21, 2022.
International Preliminary Report on Patentability and Written Opinion issued in PCT/US2021/038529, dated Oct. 19, 2021, in 8 pages.

* cited by examiner

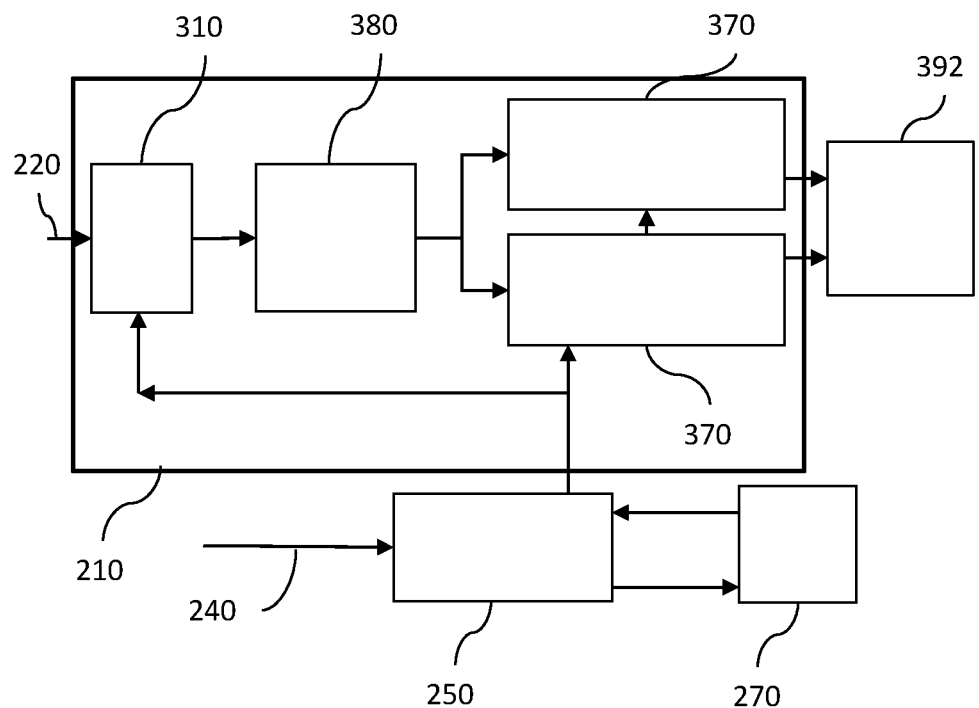
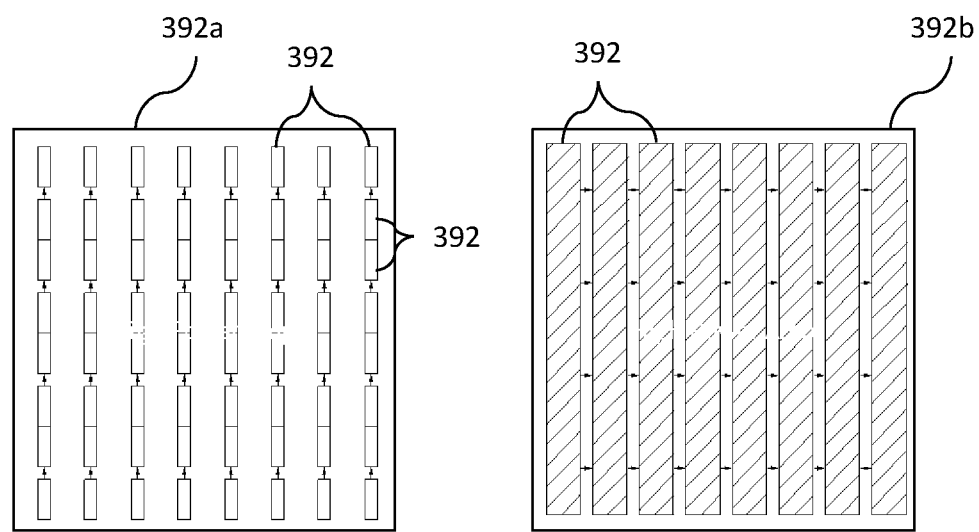
FIG. 3c

US 11,616,481 B2

SYSTEMS AND METHODS FOR MODULAR POWER AMPLIFIERS

RELATED APPLICATION(S)

This application is a continuation of U.S. application Ser. No. 17/354,971 filed Jun. 22, 2021 titled "SYSTEMS AND METHODS FOR MODULAR POWER AMPLIFIERS," which is a continuation in part of U.S. application Ser. No. 16/908,476 filed Jun. 22, 2020 titled "SYSTEMS AND METHODS FOR MODULAR POWER AMPLIFIERS," which is related to both U.S. application Ser. No. 16/779,036 filed Jan. 31, 2020 titled "APPARATUS AND METHOD FOR SYNCHRONIZING POWER CIRCUITS WITH COHERENT RF SIGNALS TO FORM A STEERED COMPOSITE RF SIGNAL" and U.S. Provisional Application No. 62/817,096, filed Mar. 12, 2019, the contents of each are hereby incorporated by reference.

DESCRIPTION OF THE RELATED ART

Radio-frequency (RF) applications often involve amplifying a RF signal to a power level suitable for applications in defense, policing, industrial applications, or the like. Amplifier arrays can be arranged in a 2D configuration, such as arranged on a single circuit board or the like, and some such circuits can be of significant size in order to contain the required number of amplifiers. Other approaches for RF amplification include radial combiners or Gysel combiners. While they allow some degree of redundancy such that the combiner can function if one is damaged, such combiners are often connectorized, making them difficult to repair.

SUMMARY

A modular power amplifier is disclosed that includes a power amplifier subsystem having a first 90 degree hybrid block configured to receive an RF signal and output a split RF signal with components having a 90 degree phase shift, a second 90 degree hybrid block configured to receive and combine the split RF signal by removing the 90 degree phase shift; and a high-power amplifier configured to amplify at least one of the components of the split RF signal. The modular power amplifier also includes a power distribution module configured to regulate an amount of power input to the high-power amplifier and a power sequencer configured to control the timing of power delivery by the power distribution module.

In some variations, the first 90 degree hybrid block can include comprising a resistor configured to dissipate at least a portion of RF power going through the first 90 degree hybrid block when the RF power is above a threshold. Also, the modular power amplifier can include a number of power amplifier subsystems, each of the power amplifier subsystems including the first hybrid block and the second hybrid block, where at least one of the plurality of the power amplifier subsystems replaces a high-power amplifier in another of the power amplifier subsystems to form a scaled power amplifier assembly.

Other variations can include waveform generation circuitry having a field-programmable gate array and a digital-to-analog converter, together configured to receive digital commands and a clock synchronization signal and to output the RF signal to the power amplifier subsystem and a phase lock loop circuit configured to provide clocking to the power amplifier synchronized with the clock synchronization signal.

In an interrelated aspect, also disclosed is a system having a power amplifier subsystem with a splitter configured to split an RF signal into a first RF component and a second RF component, a first high-power amplifier configured to amplify and output the first RF component, and a second high-power amplifier configured to amplify and output the second RF component. There may also be a differential antenna having a first input operatively connected to the first high-power amplifier to receive the first RF component and a second input operatively connected to the second high-power amplifier to receive the second RF component.

In another interrelated aspect, a modular power amplifier can have two power amplifier subsystems, each comprising: a first 90 degree hybrid block configured to receive an RF signal and output a split RF signal with components having a 90 degree phase shift, a high-power amplifier configured to amplify at least one of the components of the split RF signal, and a second 90 degree hybrid block configured to receive, combine, and output the split RF signal by removing the 90 degree phase shift. There may also be a differential antenna configured to receive the output of the second 90 degree hybrid blocks of the two power amplifier subsystems.

In yet another interrelated aspect, a three-dimensional power amplifier can include a first high-power amplifier configured to receive a first RF signal and output a first amplified RF signal, a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

In some variations, the first high-power amplifier and the second high-power amplifier are of generally planar construction and the generally planar amplifiers have the different orientations.

In other variations, the different orientations have an angle of 90 degrees between them to form a portion of a square distribution of high-power amplifiers.

In some variations, the three-dimensional power amplifier can include a cooling component located between the first high-power amplifier and the second high-power amplifier. Furthermore, the first high-power amplifier and the second high-power amplifier can be configured to receive the first RF signal and the second RF signal, both signals having a wavelength, and the first high-power amplifier and the second high-power amplifier are separated by at least approximately half of the wavelength.

In an interrelated aspect, a system can include an RF generator configured to generate RF signals having a wavelength, amplifiers configured to receive and amplify the RF signals from the RF generator and that are separated from each other by at least approximately half of the wavelength, and a power management system configured to control one or more of the amplifiers based on information received that is associated with the RF signals.

In some variations, the separation between the plurality of amplifiers can be between approximately 0.2 times the wavelength and approximately 10 times the wavelength. For example, the separation between the plurality of amplifiers can be approximately 0.25 times the wavelength, 0.3 times the wavelength, 0.4 times the wavelength, 0.5 times the wavelength, 0.6 times the wavelength, 0.7 times the wavelength, 1.0 times the wavelength, 1.5 times the wavelength, 2.0 times the wavelength, 2.5 times the wavelength, 3.0 times the wavelength, 4.0 times the wavelength, 5.0 times the wavelength, 7.0 times the wavelength, 10.0 times the wavelength, or any separation therebetween. The wavelength can be in a range between about 500 MHz and about 20.0 GHz, such as, for example, within the L-band, the S-band, the K-band, etc. In various implementations, the separation between the amplifiers can be in a range between approximately 2-18 inches or 3-7 inches. In other variations, the RF generator can be configured to generate a number of wavelengths of RF signals and the separation between the amplifiers is approximately the smallest wavelength of the wavelengths.

In other variations, the power management system can be configured to automatically determine voltages and/or currents required to turn-on and/or turn-off corresponding amplifiers in the amplifiers.

In an interrelated aspect, a system includes an RF generator can be configured to generate RF signals having a wavelength, amplifiers configured to receive and amplify the RF signals from the RF generator and that are separated from each other by at least approximately half of the wavelength, a sensor configured to detect at least one sensed characteristic associated with at least one amplifier of the amplifiers, and a power management system configured to control one or more of the amplifiers based on the sensed characteristic.

In yet another interrelated aspect, a computer program product is disclosed that causes operations including transmitting, from a modular component, a request for an IP address, transmitting, from the modular component, a subnet address of the modular component based on a port that the modular component is connected to, and assigning, by an address server, an IP address to the modular component based on the subnet address of the modular component.

In some variations, the modular component can be a modular power amplifier configured to amplify an RF signal. The operations can include providing a bias voltage to the modular power amplifier based on the IP address. Also, the address server can be a Radio Frequency System-on-Chip (RFSoC).

Implementations of the current subject matter can include, but are not limited to, methods consistent with the descriptions provided herein as well as articles that comprise a tangibly embodied machine-readable medium operable to cause one or more machines (e.g., computers, etc.) to result in operations implementing one or more of the described features. Similarly, computer systems are also contemplated that may include one or more processors and one or more memories coupled to the one or more processors. A memory, which can include a computer-readable storage medium, may include, encode, store, or the like, one or more programs that cause one or more processors to perform one or more of the operations described herein. Computer implemented methods consistent with one or more implementations of the current subject matter can be implemented by one or more data processors residing in a single computing system or across multiple computing systems. Such multiple computing systems can be connected and can exchange data and/or commands or other instructions or the like via one or more connections, including but not limited to a connection over a network (e.g., the internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims. While certain features of the currently disclosed subject matter are described for illustrative purposes in relation to particular implementations, it should be readily understood that such features are not intended to be limiting. The claims that follow this disclosure are intended to define the scope of the protected subject matter.

BRIEF DESCRIPTION OF THE DRAWINGS

The accompanying drawings, which are incorporated in and constitute a part of this specification, show certain aspects of the subject matter disclosed herein and, together with the description, help explain some of the principles associated with the disclosed implementations. In the drawings:

FIG. 3c is a simplified block diagram illustrating an amplifier subsystem implemented with an antenna array, in accordance with certain aspects of the present disclosure;

DETAILED DESCRIPTION

The present disclosure provides examples of systems and methods for power amplifiers that provide several benefits over the state of the art. For example, amplifier systems are disclosed that have higher power density, are compact, scalable, have improved cooling, have reduced electromagnetic interference (EMI), etc. Such features are important for providing compact, high-power RF amplification, with applications in industry, defense, radar, communications, signal jammers, etc.

Figure 1:
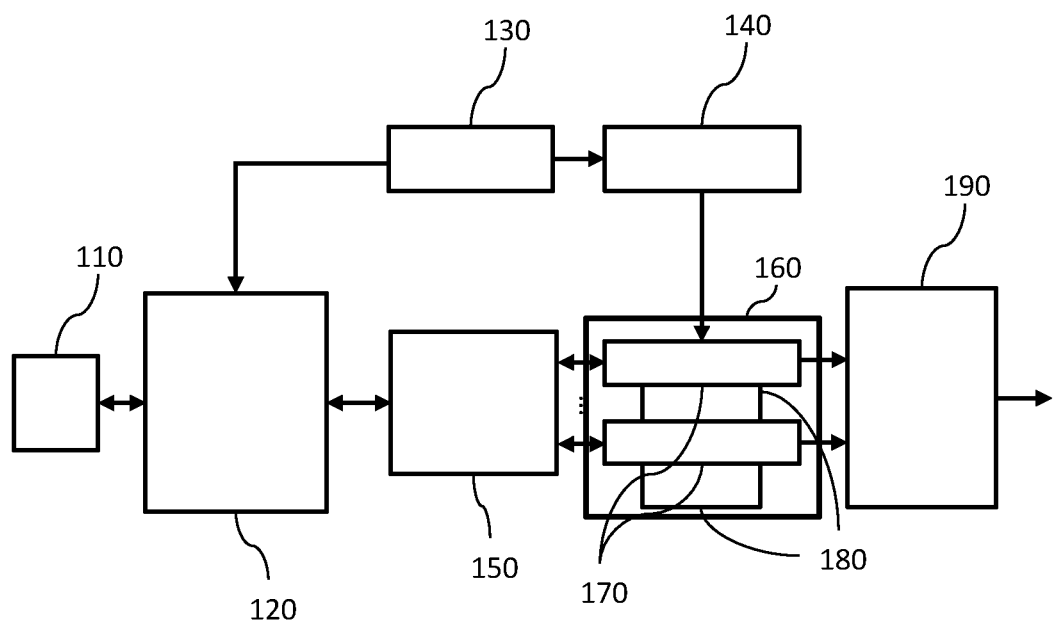
FIG. 1 is a simplified block diagram illustrating an amplifier and control system, in accordance with certain aspects of the present disclosure.

The overall system, as shown in FIG. 1, is designed for high power radio frequency transmissions, such as in high power microwave, directed energy, radar, and communications applications. The mission computer 120 runs the software code controlling the system, generally receives control commands, and prioritizes the hardware according to those commands. For example, the mission computer, in a directed energy application, receives inputs about the location of targets such as automated target cues from an external radar, from a user who is using a user console to select targets, or from an automated target recognition and classification software based on image or radar inputs. The mission computer 120, also receives firing commands from a user such as whether to fire. The mission computer has many different modes it can run even for a firing command such as to raster a beam around a target, how many shots to fire, and in target swarm scenarios, which target to prioritize first for firing. Resource management decisions such as which targets to fire on first, such as the closest target, how many targets can be fired on with a single beam such that multiple targets fit within the same beam width, how fast the pulse width of the waveform needs to be, what frequency and what pulse repetition interval the waveform needs to be are all automatically decided based on a target recognition system or through user command resides in the mission computer 120. The mission computer, 120 can translate these into beam steering commands and waveform commands into phase and waveform commands for the hardware to produce to send to the waveform generator or the RF field programmable gate array (FPGA) 150. These waveform commands are also synchronized with the turning on and turning off of line replaceable amplifier modules, 170. In some embodiments the waveform is generated directly in the amplifier modules 170, if a direct digital synthesizer or waveform generator is contained in the amplifier modules, 170, instead of the waveform generator RF FPGA 150. The amplifier modules 170 can be optionally integrated with a temperature cooling system 180 which can prevent overheating of the amplifier modules 170. The unit is generally connected to a generator or some other power Alternating Current (AC) power source, and this connection is made through the AC power system 130. The AC power system often has current monitoring, current control, and on/off switches that are controlled in the preferred embodiment by the mission computer 120. The AC power system also translates voltages and can also translate from AC to DC with AC/DC conversion. In some systems this AC/DC conversion happens in a centralized way right after the AC power is received from the AC power unit 130, or in other embodiments the AC/DC conversion is done locally on each modular power amplifier 170, where each one has its own power distribution unit 140. In some embodiments the AC/AC conversion and AC/DC conversion is done in multiple steps, where voltage and current levels are changed, this is done in the AC power unit 130. The power distribution unit (PDU), 140 can generally translate the voltage to the final direct current (DC) voltage needed by each amplifier input. In the preferred embodiment, there are 65 volt, 50 volt, and 12 volt regulators on board the power distribution unit for the modular power amplifier voltages that are needed. The PDU 140 regulates these voltages, also stores energy to provide impulses of power without the voltage level drooping, and generally is in charge of providing a DC voltage required to drive power amplifiers in amplifier modules 170. The PDU 140 may also have current sensors, current monitoring, and current limiters. The system can be configured as a phased array configuration, so multiple power amplifier can be connected to an array of radiating antennas 190. These antenna elements 190, can have special connectors designed to handle very high voltage levels and power levels, in the directed energy application. The antenna elements can comprise matching circuits that match their impedance to the impedance of the modular power amplifiers. In other embodiments of this system, the antenna elements, 190 are also used to receive RF energy and this RF energy is fed back into the transmit/receive modules, 170. Overall, the mission computer 120 commands waveforms and the power sources, the power sources 130 and 140 translate power into the precise voltages and currents needed on the power amplifiers in the amplifier modules 170 that amplify the RF signal to very high levels and radiate out of the antennas 190.

One exemplary embodiment utilizing concepts disclosed herein is illustrated in FIG. 1. Shown is a user input device 110, which can be a computer, tablet, smartphone, or any computing device capable of receiving text, mouse, touch, voice commands, etc. from a user. Such input or commands from input device 110 can be received at one or more computers 120 controlling operation of an amplifier system. Computer 120 can also be in communication with power supplies for the amplifier systems disclosed herein. For example, an AC (or DC) power supply 130 can be controlled by computer 120 to deliver power to a power distributor 140.

The actual RF pulse amplified by the amplifier systems disclosed herein can be generated from one or more RF FPGAs 140 that may be in communication with computer 120. The RF FPGA generates the radio frequency waveforms through a digital to analog converter (DAC). The DAC can have a digital input which can receive a stream of binary data that represents the amplitude of the analog waveform that is output. This binary data can be fed from computer memory where the binary representation of the samples of a waveform is stored or the binary data can be generated by direct digital synthesizers (DDS). Some embodiments may include an array of DACs, each with its own binary stream. The binary stream can be controlled such that there is a phase offset between the waves going to the different DACs to create a phased array.

RF FPGA 140 can provide RF signals to be amplified to an amplifier assembly 160 containing an arbitrary number of modular power amplifiers 170. As described in further detail herein (e.g., with reference to FIGS. 7-9), such modular power amplifiers 170 can have an efficient 3D configuration in the amplifier assembly, allowing for numerous technical improvements over conventional 2D amplifier systems. For example, cooling elements such as fans, heat sinks, etc. can be interspersed within the amplifier assembly between two or more of the modular power amplifiers. The output of the modular power amplifiers can then be delivered to an antenna array 190, which may be a part of an electromagnetic pulse (EMP) system.

Examples of applications of the disclosed systems can include L-band systems capable of providing RF power output in the kilowatt range (e.g., 1 kW, 3 kW, 5 kW, 12 kW, 20 kW, etc.), though power output can vary with implementation and should not be limited to the examples provided. Similarly, the RF frequencies that may be utilized in the disclosed systems need not be limited to L-band systems but may include other frequencies as well, such as for example, S-band, K-band, etc.

Figure 2:
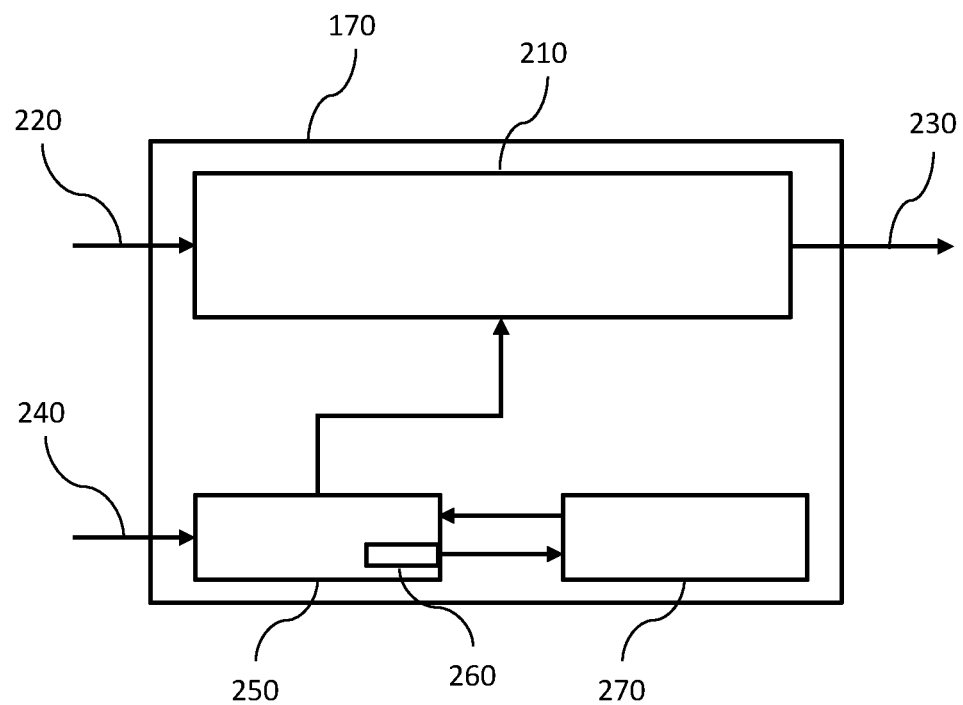
FIG. 2 is a simplified block diagram illustrating a modular power amplifier, in accordance with certain aspects of the present disclosure.

A block diagram of an exemplary embodiment of a modular power amplifier is illustrated in FIG. 2. The modular power amplifier 170 can include an amplifier subsystem 210, which can receive RF input signal 220 and provides an amplified RF output signal 230. Modular power amplifier 170 can receive input driving/biasing power 240 at a power distribution module 250 and a power sequencer 270. These components can provide driving/biasing power for components of the modular power amplifier, as described in further detail herein. In this way, an amplifier subsystem 210 can be independently controlled to provide a particular RF output signal.

In some implementations, power distribution module may include a current sensor 260 for monitoring of current output to the amplifier subsystem. The current sensor can then provide information to the power sequencer to adjust the power output from the power distribution module. Reading the current of the power amps during operation alerts the system to the health of the power amplifiers, that the current is within the expected range. The current also enables the system to infer the temperature of the power amplifiers during operation since the current can rise for a given power output as the temperature increases. The current sensor can also be used to detect the set point of the power amplifiers prior to operation; when the power amplifiers are off with no RF input, leakage current can change as a function of the bias current being applied. This leakage current is read in the current sensor until the desired current is detected, and thus gives the desired gate voltage set point that should be applied during operation. Without any loss of generality, the leakage current can be the bias current at the drain terminal of a FET amplifier. In one embodiment, the set point can be detected automatically prior to operation by slowly tuning the gate bias voltage until the ideal leakage current is detected. This voltage bias set point can be stored in memory and then during operation, applied when RF is applied. If the current reading is either very low, indicating the power amplifier is no longer pulling any power, or it is very high, indicating a short, this indicates the power amplifier is no longer operational. In this way, the health of the power amplifier can be determined by reading the current.

The power distribution module 250 can be configured to regulate an amount of power input (e.g., input power 240) to intermediate power amplifier(s) (see, e.g., FIG. 3) of the amplifier subsystem. Specifically, the power distribution module 250 can receive power at a given voltage, but provide power as needed (e.g., 50V, 65V, etc.) to the amplifier subsystem.

The power distribution module 250 provides several features. First it can regulate the voltage received from the power supply to the power amplifiers, such as a 50 volt supply to the drain of the gallium nitride power amp transistors. In some embodiments, the power distribution unit can provide DC to DC conversion of the voltage (e.g., acting as a voltage divider), such as if the incoming voltage from the power supply is much higher than the power amplifier voltage. Second, power distribution module 250 can contain current sensor 260 where the power distribution unit 270 detects the current and reports the current back to the power sequencer for use in determining gate voltage bias set point and power amplifier health. Third, the power distribution unit 250 can also provide a current limiter to limit the current to the power amplifiers; this prevents the power amplifiers from blowing out should any errors occur such as a short, electromagnetic interference, loss of power, or other causes that would cause an incorrect gate bias voltage, and thus a dangerous over-current situation without a current limiter. In some embodiments, no more than 3 amps of current can go through the power amplifiers before failure, so such a current limiter on the PDU can be set to 3 amps. The power distribution unit consists of voltage regulators, analog to digital converters to read the current, as well as a current limiter circuit made of transistors, diodes and resistors.

In some implementations power sequencer 270 can be configured to control the timing of power delivery by the power distribution module. For example, the power sequencer can turn on or off the gate bias to the intermediate power amplifiers in synchronization with the RF input. This has the benefit of controlling the power and improve heat dissipation. The power sequencer circuit can include analog to digital converters (ADC) to read voltages and currents from power amplifier circuits, digital to analog converters (DAC) to apply voltages to power amplifier circuits, such as gate bias voltages, as well as a processor such as a microcontroller or field programmable gate array (FPGA). The power sequencer can have digital input pins for receiving commands when radio frequency signals are being applied to the amplifier circuit. In this way the power sequencer can apply a gate bias voltage to turn the power amplifier "ON" just as RF signals are flowing through the power amplifier and then remove the gate bias voltage to turn the power amplifier "OFF" when no RF is flowing to save power. The power sequencer also has a memory to store gate bias set points. In the preferred embodiment, the power sequencer can have a plurality of ADCs and DACs to control multiple power amplifiers simultaneously.

Figure 3A:
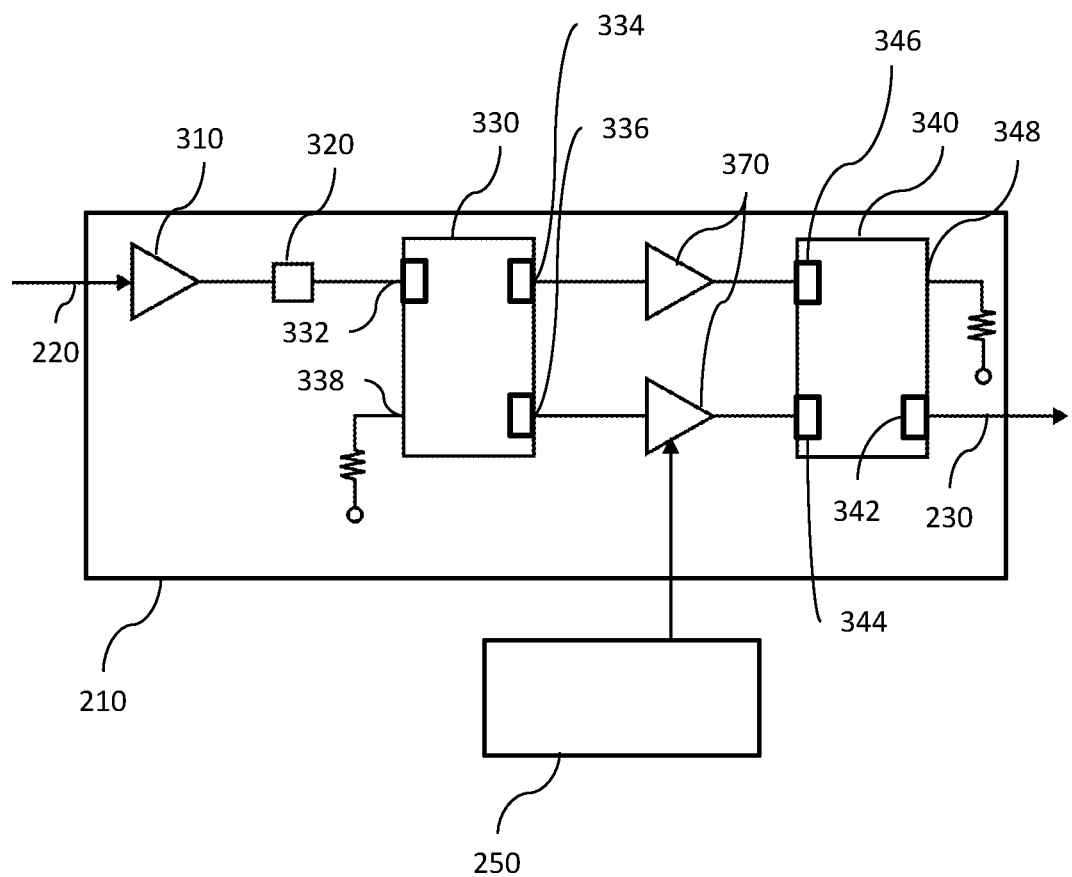
FIG. 3a is a simplified block diagram illustrating an amplifier subsystem, in accordance with certain aspects of the present disclosure.

Amplification of the RF input signal for a given modular power amplifier occurs in one or more amplifier subsystems. As shown in FIG. 3a, an example amplifier subsystem 210 (of modular power amplifier 170) can receive RF input signal 220 at an optional preamplifier 310, which is in turn connected to bandpass filter 320. Bandpass filter 320 can limit the frequency ranges of the signals passing through the system to a specified bandwidth. Power amplifiers can provide higher power out and higher gain when the bandwidth is smaller, so limiting bandwidth helps increase the gain and power of the amplifier system. Bandpass filter 320 can also eliminate out-of-band spurs, harmonics, and other out-of-band content. In other embodiments, bandpass filter 320 can instead be a low-pass filter or a high-pass filter to eliminate either high frequency content or low frequency content, respectively.

Amplifier subsystem 210 can also include, in some implementations, a number of 90 degree hybrid blocks that can split or combine an RF signal by respectively adding or removing a 90 degree phase shift to the split RF signal. Such RF signal components can be amplified individually and later recombined. For example, a first 90 degree hybrid block 330 can be configured to receive an RF signal and output a split RF signal with components having a 90 degree phase shift. As shown in FIG. 3a, 90 degree hybrid block 330 can have RF i/o port 332, a "0 degree" port 334, and a "90 degree" port 336. The 90 degree hybrid block 330 receives the RF signal at the RF i/o port 332 and the split RF signal components are respectively output through the 0 degree port 334 and the 90 degree port 336. The 90 degree hybrid block 330 can also have a dump port 338 which includes a termination to dump mismatches.

A similar, or even identical, second 90 degree hybrid block 340 in the amplifier subsystem 210 can be configured to receive and combine the split RF signal by removing the 90 phase shift. As apparent from FIG. 3a, the unshifted RF signal component from the 0 degree port 334 goes into the 90 degree input port 346. Similarly, the shifted RF signal component from the 90 degree port 336 goes into the 0 degree input port 344. The two signals can be combined and output through RF i/o port 342. 90 degree hybrid block 340 can also have a dump port 348.

In some implementations, a high-power amplifier(s) 370 can be configured to amplify at least one component of the split RF signal. For improvement of the amplification process, the bias for the high-power amplifier 370 can be independently controlled via the power distribution module. The 90 degree hybrid combiner block 340 combines the two high-power amplifiers 370, to create a signal of double the power that the individual high-power amplifier 370, can produce, and transmits this out of the output port of the hybrid power amp 230. In FIG. 3a, the power distribution module 250 and power sequencer module 270, are connected to the high-power amplifiers 370. In one embodiment, the power sequencer 270 can control the gate bias voltage to some or all of the amplifiers in the hybrid combination network such that they are synchronized. In some embodiments, the power sequencer module 270 turns on the pre amplifiers 310 just before the high power amplifiers 370.

In other implementations, any/either/both 90 degree hybrid block can include a resistor configured to dissipate at least a portion of RF power going through the 90 degree hybrid block when the RF power is above a threshold. For example, such power dissipation can be used to reduce voltage standing wave ratio effects, thus improving the robustness of the amplifier system.

In many power amplifier systems the voltage standing wave ratio (VSWR is a measure of the efficiency of power transmitted/radiated out of the antenna. If power gets reflected back into the power amplifier system, this reduces the efficiency of the power amplifier system since not all of the input power is transmitted/radiated, and high power levels such as with high power microwave and electromagnetic pulse applications, jamming, and high power radar, can damage the power amplifier system. In implementations using other means of power combining, such as using Gysel combiners or radial combiners, if one leg of the circuit fails due to lack of protection, the entire 2-way, 4-way, or many-way combined Gysel or radial circuit can completely fail. In this way, the disclosed resistive dissipation provides a significant technical improvement over prior art systems. While one VSWR ratio that is usually acceptable is no more than 2:1, 1.5:1 can be used for conservative systems. Power combiners, such as the 90 degree hybrid approach discussed herein, can dissipate VSWR levels at up to 10:1 (and potentially higher) and so is very safe. VSWR depends on how well matched the resonant frequency of the power amplifier circuit is to the resonant frequency of the antenna. In some implementations, matching circuits can be created such that multiple frequencies are resonant in the power amplifier and the antenna is broadband and covers many frequencies. As the frequency being transmitted differs from the resonant frequency the VSWR gets worse. Temperature variations can also degrade VSWR, other antenna elements in an array mutually coupling also degrades VSWR, anything that changes the impedance of the circuit changes VSWR. Thus, VSWR can change very dynamically throughout the operation of a radio frequency system, and instantaneously, it is possible for the VSWR to reach to very high levels such as up to 10:1 (or more), illustrating the benefits of the disclosed protective circuit.

Figure 3B:
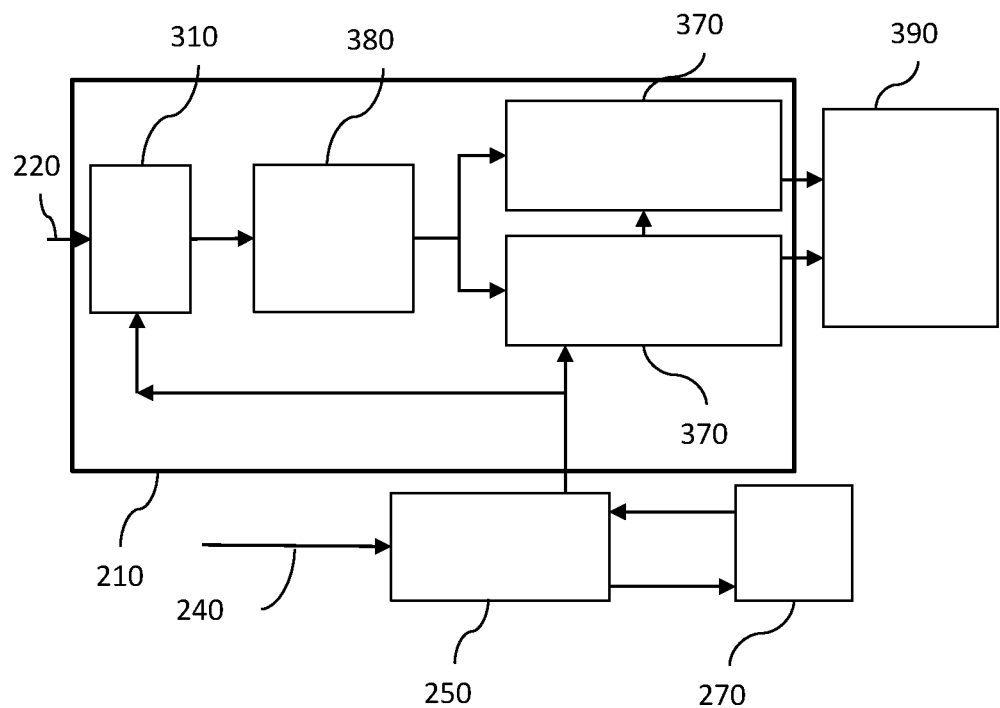
FIG. 3b is a simplified block diagram illustrating an amplifier subsystem implemented with a differential antenna, in accordance with certain aspects of the present disclosure.
Figure 3D:
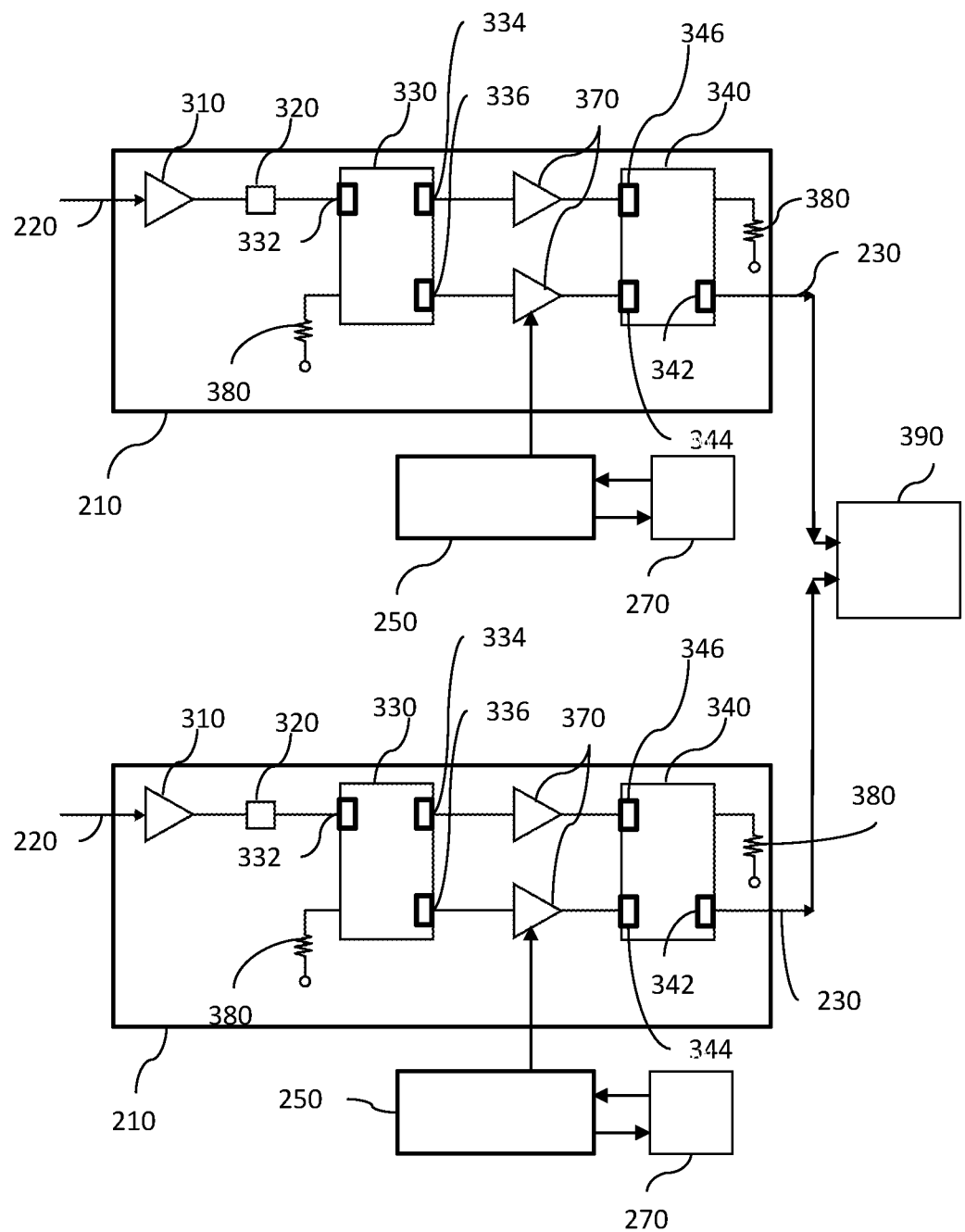
FIG. 3d is a simplified block diagram illustrating multiple amplifier subsystems implemented with a differential antenna, in accordance with certain aspects of the present disclosure.

FIGS. 3b-3d illustrate embodiments utilizing a differential antenna with certain aspects of the present disclosure. FIG. 3b illustrates an exemplary embodiment of a power amplifier subsystem having a splitter 380 configured to split an RF signal into a first RF component and a second RF component. Such a splitter can be configured to split the RF signal into two RF components of varying amplitude (e.g., a 50/50 splitter, 70/30 splitter, etc.). The system can further include a first high-power amplifier 370 configured to amplify and output the first RF component and a second high-power amplifier 370 configured to amplify and output the second RF component. The high-power amplifiers 370 in FIGS. 3b-d can be similar to other high-power amplifiers disclosed herein (e.g., high-power amplifier 370 as discussed with reference to FIG. 2).

Differential antenna 390 can have a first input operatively connected to the first high-power amplifier to receive the first RF component and a second input operatively connected to the second high-power amplifier to receive the second RF component. In some embodiments this embodiment can reduce the number of (or eliminate entirely) the need for combining circuitry. In any of the disclosed implementations, the differential antenna can be a high-impedance low-profile planar aperture 392. A number of such high-impedance, low-profile apertures 392 can be implemented to form an array such as a connected dipole array 392a, or its conjugate, a long-slot array antenna 392b with orthogonal polarization, as also illustrated in FIG. 3c. The connected dipole array can include gaps having an approximately 300-ohm gap impedance (denoted by the arrows between various high-impedance, low-profile apertures 392). The long-slot array antenna 392b can include an array of long slots excited at Nyquist interval by differential amplifiers. One advantage of such designs is eliminating the need of a conventional balun, and hence reducing the depth of the array antenna and the front-end RF loss.

FIG. 3d illustrates how the previously disclosed amplifier subsystems 210 can be utilized with a differential antenna. Here, a modular power amplifier can have two power amplifier subsystems. Each power amplifier subsystem can include a first 90 degree hybrid block configured to receive an RF signal and output a split RF signal with components having a 90 degree phase shift, a high-power amplifier configured to amplify at least one of the components of the split RF signal, and a second 90 degree hybrid block configured to receive, combine, and output the split RF signal by removing the 90 degree phase shift. Similar to the implementations in FIGS. 3b,c, a differential antenna can be configured to receive the output of the second 90 degree hybrid blocks of the two power amplifier subsystems.

Figure 4:
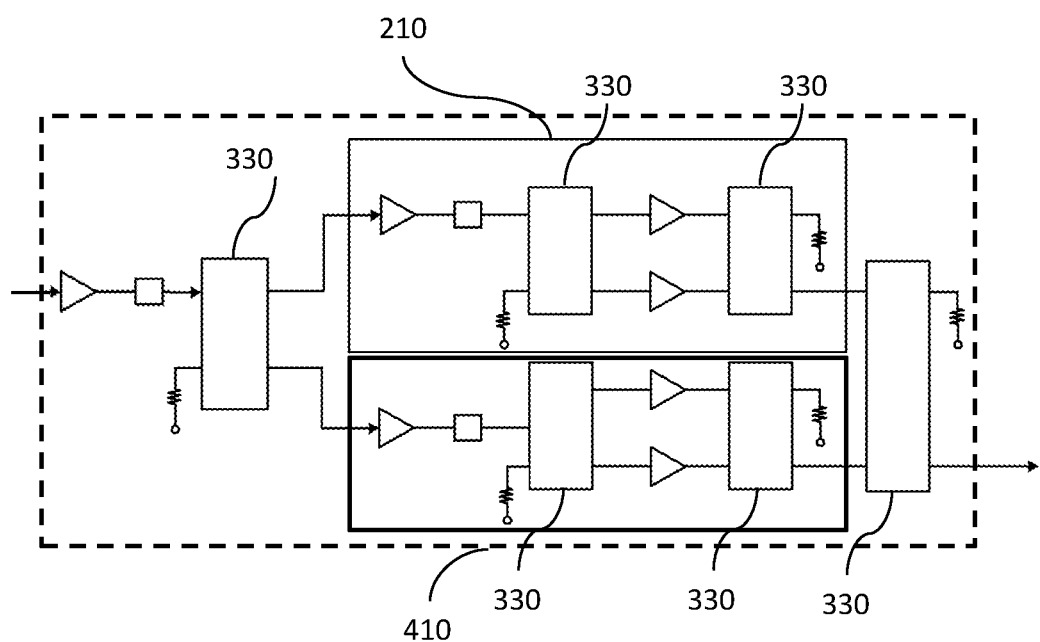
FIG. 4 is a simplified diagram illustrating the combining of amplifier subsystems into a scaled power amplifier assembly, in accordance with certain aspects of the present disclosure.

FIG. 4 illustrates how implementations of the present disclosure can allow the formation of a scaled power amplifier assembly 410 that combines multiple amplifier subsystems into a circuit equivalent to a single amplifier subsystem but having increased gain. In the example of FIG. 4, two power amplifier subsystems are shown, each including the first hybrid block and the second hybrid block. However, these power amplifier subsystems 210 are integrated into scaled power amplifier assembly 410 where they have replaced the intermediate power amplifier(s) in another power amplifier subsystem to form the scaled power amplifier assembly 410. Such scaling can be extended to combine any number of power amplifier subsystems in a scaled power amplifier assembly (that may itself be made up of scaled power amplifier assemblies). While the implementation in FIG. 4 illustrates the combination of three power amplifier subsystems, any number of power amplifier subsystems can be utilized, for example, 2, 4, 5, 6, 10, etc.

Figure 5:
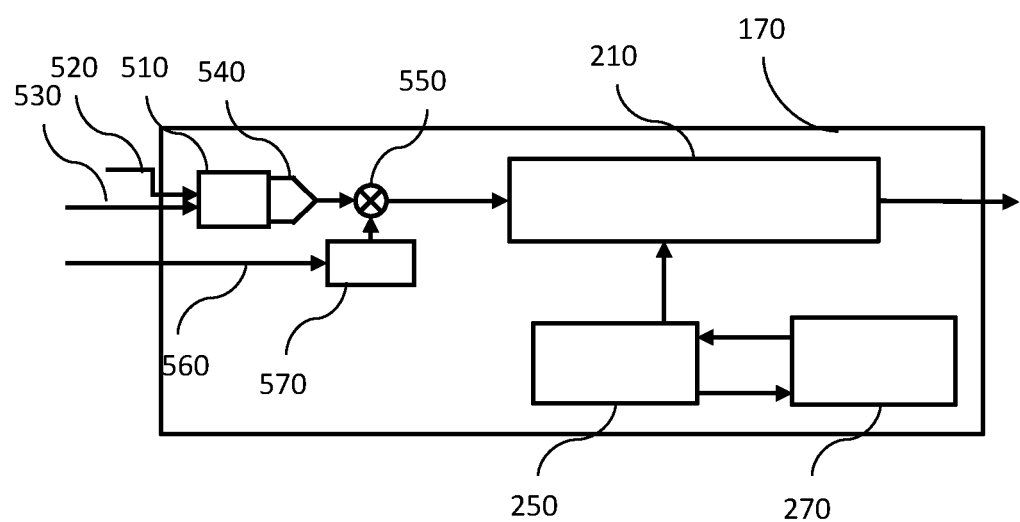
FIG. 5 is a simplified block diagram illustrating the generation of RF signals for amplification, in accordance with certain aspects of the present disclosure.
Figure 6:
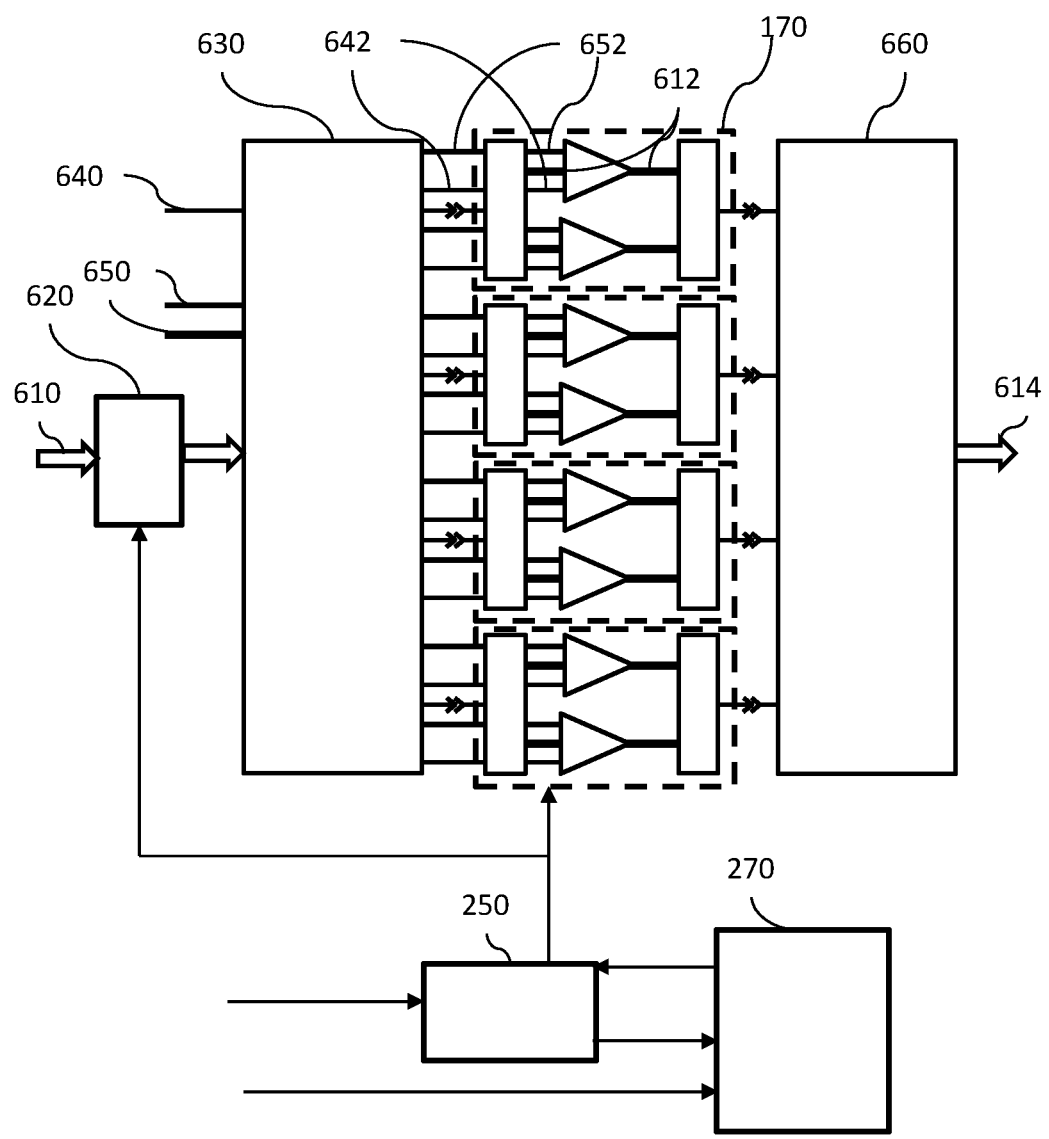
FIG. 6 is a simplified block diagram illustrating a parallel amplifier system, in accordance with certain aspects of the present disclosure.

In some embodiments, as shown in FIG. 5, the waveform generation circuitry is embedded into the amplifier module 170 itself instead of having a radio frequency signal be provided as input to the amplifier module. This is a distributed method of waveform generation where a digital command is provided to the input of the amplifier module 170 instead of a radio frequency input. In some embodiments, the input 530 can contain a digital message with a phase offset value, amplitude, and a frequency value to command the module to transmit an RF waveform with the specified waveform and phase offset. These commands can also become more complex such as a series of commands such that the amplitude, phase offset and frequency vary as a function of time. A clock sync signal 520 can be input that originates at a common source such as a master clock with the purpose of synchronizing multiple modular power amplifiers so they can transmit commands phase-coherently to one another. This clock sync pulse can be used to align the digital clocks within the module to the sync pulse. The phase locked loop (PLL) sync clock 560 can be input into a PLL circuit 570 such that the PLL circuit 570 provides the clocking to the rest of the module and synchronizes with the PLL input 560 as another mechanism to synchronize the clocks. In some embodiments, an FPGA 510 and digital to analog converter 540 receive digital commands and the clock synchronization signal and translate the digital commands into a radio frequency signal for the power amplifier subsystem. In other embodiments, a direct digital synthesizer (DDS) chip is used instead of an FPGA and a DAC. In some embodiments, the RF signal generated from the DAC 540 is a sufficiently high frequency and is converted to the desired RF frequency by the DAC and input into the amplifier module 210. In other embodiments the DAC 540 outputs an intermediate frequency (IF) which is upconverted using a mixer subsystem 550 to the final desired frequency. There are multiple ways the mixing can be done, such as homodyne mixing, heterodyne mixing, etc. As illustrated in the example of FIG. 6, the modular aspects of the disclosed amplifier systems can be utilized in a parallel configuration to provide high-gain amplification of an RF input signal 610. In some implementations, a driver amplifier 620 can receive the RF input signal 610 and provide an RF output (e.g., approximately 50 W) to a power divider 630. The power divider 630 can be coupled to modular power amplifiers 170 arranged in parallel and configured to receive and amplify respective RF signals from the power divider 630. Implementations of the disclosed amplifier systems can then result in RF output power of at least 12 kW (e.g., from the combined output of four 3 kW amplified RF signals from modular power amplifiers 170). Optionally, the power divider can receive control signals 640 to control the splitting of the RF input signal. Also, the power divider can have various power channels 650, including inputs and/or returns for AC and/or DC power. The power divider 630 can be a Wilkinson power divider or other circuit that divides the incoming signal power evenly between multiple output channels.

The illustrated examples of modular power amplifiers 170 can be substantially similar to any of those described throughout the present disclosure. However, also shown in the implementation of FIG. 6 are control channels 642 (e.g., for providing control signals to the modular power amplifier 170 and its various components), power channels 652 (e.g., for providing power to various modular power amplifier components), and RF channels (e.g., for directing RF between various power amplifier components).

In some implementations, illustrated for example in FIG. 6, a high-power combiner assembly 660 can be coupled to the modular power amplifiers 170 and configured to combine respective RF output signals from the modular power amplifiers 170. The power combiner assembly can be a Wilkinson power combiner, radial power combiner, or Gysel power combiner. In this way, a single, greatly amplified RF output signal 614 can be generated.

As used herein, the term "parallel" can mean geometrically parallel (e.g., disposed in parallel planes) or electrically parallel (e.g., not in series). For example, the block diagram illustrated in FIG. 6 shows how the disclosed system has aspects that are electrically parallel, but not necessarily geometrically parallel. An example implementation having aspects that are specifically not geometrically parallel is shown in FIG. 7, below, where some of the generally planar amplifier circuits are oriented orthogonally to each other.

Figure 7:
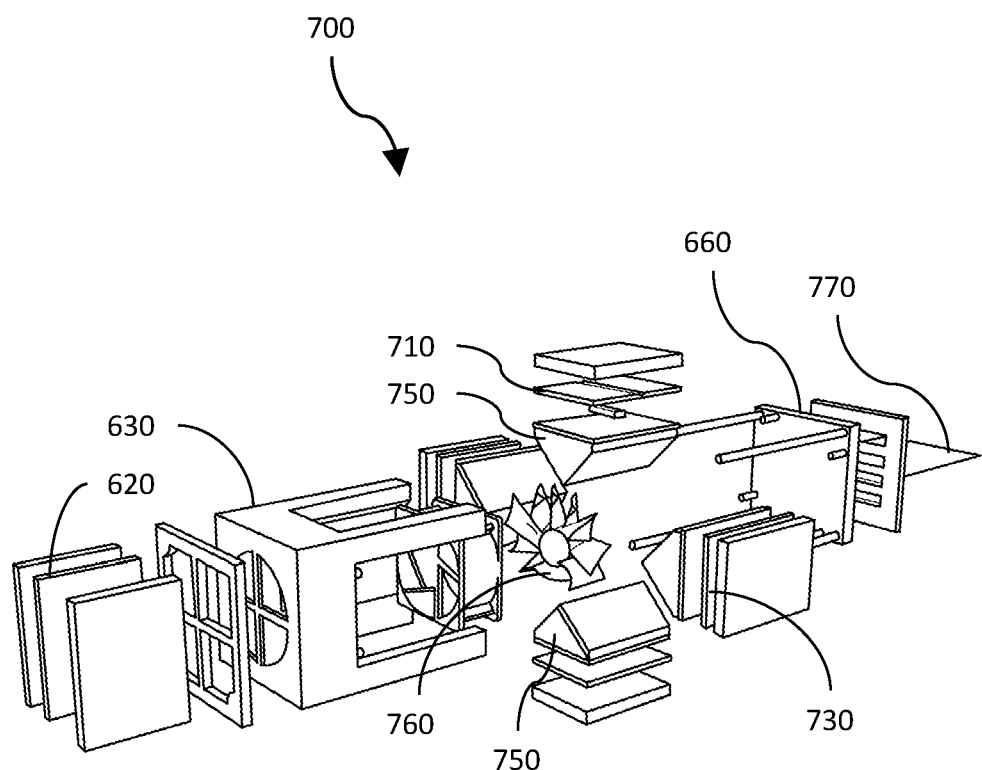
FIG. 7 is a simplified block diagram illustrating a 3D power amplifier, in accordance with certain aspects of the present disclosure.

FIG. 7 illustrates an implementation with a 3D configuration of amplifiers having the benefits of, for example, reduced electromagnetic interference, efficient use of space, and access to cooling mechanisms. As shown in FIG. 7 one implementation of a three-dimensional power amplifier 700 can include a first modular power amplifier 710 configured to receive a first RF signal and output a first amplified RF signal. The three-dimensional modular power amplifier 700 can also have a second modular power amplifier 730 configured to receive a second RF signal and output a second amplified RF signal. In some embodiments, RF input signals can be received by 90 degree hybrids (which may be similar to the 90 degree hybrid 330 in FIG. 3a). RF signals can be similarly power combined into another 90 degree hybrid output block (which may be similar to the 90 degree hybrid

340 in FIG. 3*a*). Various implementations can have the second high-power amplifier 730 can have a different orientation than the first high-power amplifier 710. Thus, the different orientations can cause a reduction in electromagnetic interference between the first high-power amplifier and the second high-power amplifier. Also, antenna 770, for three-dimensional power amplifier 700, can optionally be part of antenna array 190 depicted in the implementation of FIG. 1.

As used herein, the term "orientation" refers to an orientation of the high-power amplifier in 3D space. For example, the high-power amplifier may be a somewhat planar circuit oriented generally horizontally. As described above, a different high-power amplifier may have a different orientation (e.g., generally vertically). Because such high-power amplifiers may generally be of substantially similar construction, it would be understood by a person of skill what it means to have two high power amplifiers have different orientations. Furthermore, while the present disclosure contemplates that high-power amplifiers may have different orientations, this can also include other circuitry (besides the high-power amplifiers) such as the 90° hybrids, splitters, FPGAs, etc. Any combination of the components disclosed herein that are associated with a given high-power amplifier can thus have a particular orientation which may be different than any other combination of components associated with another high-power amplifier.

Some implementations can include the first high-power amplifier and/or the second high-power amplifier being of generally planar construction and the generally planar amplifiers can have different orientations. Accordingly, in some implementations, the first high-power amplifier and the second high-power amplifier can be constructed on printed circuit boards and disposed to have the different orientations.

The present disclosure contemplates the non-parallel orientations of these high-power amplifiers can mitigate electromagnetic interference between the amplifiers by, for example, reducing interference (constructive or destructive). When the present disclosure notes that two amplifiers are "not in the same plane," this means that they are non-coplanar but may be in parallel planes. When high-power amplifiers (or other circuitry) has the same orientation, metal shielding can be included around one or more locations to mitigate EMI. In some embodiments, some portions of the disclosed system can have high-power amplifiers parallel to each other, either vertically or horizontally. This can be in combination with any non-parallel arrangements of circuits, as discussed below and elsewhere herein.

As shown in FIG. 7, the different orientations can have an angle of 90 degrees between them to form a portion of a square (or rectangular) distribution of high-power amplifiers. Orienting at a 90 degrees angle around a heat sink, (such as a piece of metal or a fan) also helps to ease thermal constraints and remove heat.

In other implementations, the different orientations can have an angle of 120 degrees between them to form a portion of a hexagonal distribution of modular power amplifiers. In yet other implementations, the different orientations can have an angle of 60 degrees between them to form a portion of a triangular distribution of modular power amplifiers. In general, any geometric distribution of modular power amplifiers is contemplated, further including parallelograms or other polygonal or irregular shapes. In this way, most generally, the present disclosure contemplates that at least two of the power amplifiers may not be geometrically parallel, for at least the above-described benefits of heat removal and reduction of EMI.

As shown in FIG. 7, in other implementations, there can be a third high-power amplifier having an orientation substantially perpendicular to the first high-power amplifier and a fourth high-power amplifier having an orientation substantially perpendicular to the second high-power amplifier. Such a configuration is similar to the square distribution described above, but also includes parallelogram-shaped distributions.

As discussed, the disclosed three-dimensional power amplifier has several technical advantages, including improved cooling due to the ability to of, for example, generally planar modular power amplifiers, to have their planes facing a cooling element. This can expose an increased surface area to a cooling element and thus improve cooling. Cooling elements can include, for example, a heat sinks, fans, etc. with number and any sort of cooling element implemented. As shown in FIG. 7, there can be a cooling component (e.g., heat sink 750) located proximate to the first high-power amplifier or the second high-power amplifier. Also, a fan 760 can be included to provide direct air cooling over the amplifier circuitry and heat sinks.

The amplifier designs contemplated herein provide improved mitigation of electromagnetic interference. In some implementations, this can include providing electromagnetic shielding between the first high-power amplifier and the second high-power amplifier. Such electromagnetic shielding can include, for example, Faraday cages, RF absorptive foam, RF reflective materials, etc. In some implementations, such shielding can be located around or between modular power amplifiers.

Some implementations can provide further mitigation by virtue of the separation between any adjacent parallel modular power amplifiers. For example, the first high-power amplifier and the second high-power amplifier can be configured to receive the first RF signal and the second RF signal, both signals having a wavelength, and the first high-power amplifier and the second high-power amplifier are separated by at least approximately half of the wavelength. In some embodiments, the amplifiers can be separated by less than half a wavelength. Such arrays can be challenging to integrate from a mechanical packaging standpoint due to the tight spacing, but can provide higher power per unit area. In other embodiments, the amplifier modules are separated by more than half a wavelength. Any spacing more than half a wavelength can cause a smaller grating-lobe free field of regard. At a half-wavelength spacing, a beam can be scanned over a 180 degree field of regard from the array. As the spacing increases up to lambda (the wavelength), the grating lobe free field of regard is reduced. In one a 0.7 lambda spacing can be used, which allows more space to fit the modules but also allows a larger area for the antenna array. As the gain is related to the area of the antenna array, moving out the modules enables higher gain. Separations can include, for example, 5 inches, which can be appropriate for some L-band phased array application. Other separations are contemplated, based on the wavelength of the RF being amplified, as discussed above, or other separations that act to mitigate interference. In some implementations, the wavelength used is the wavelength of the highest frequency (or smallest wavelength) being used in the design.

Figure 8:
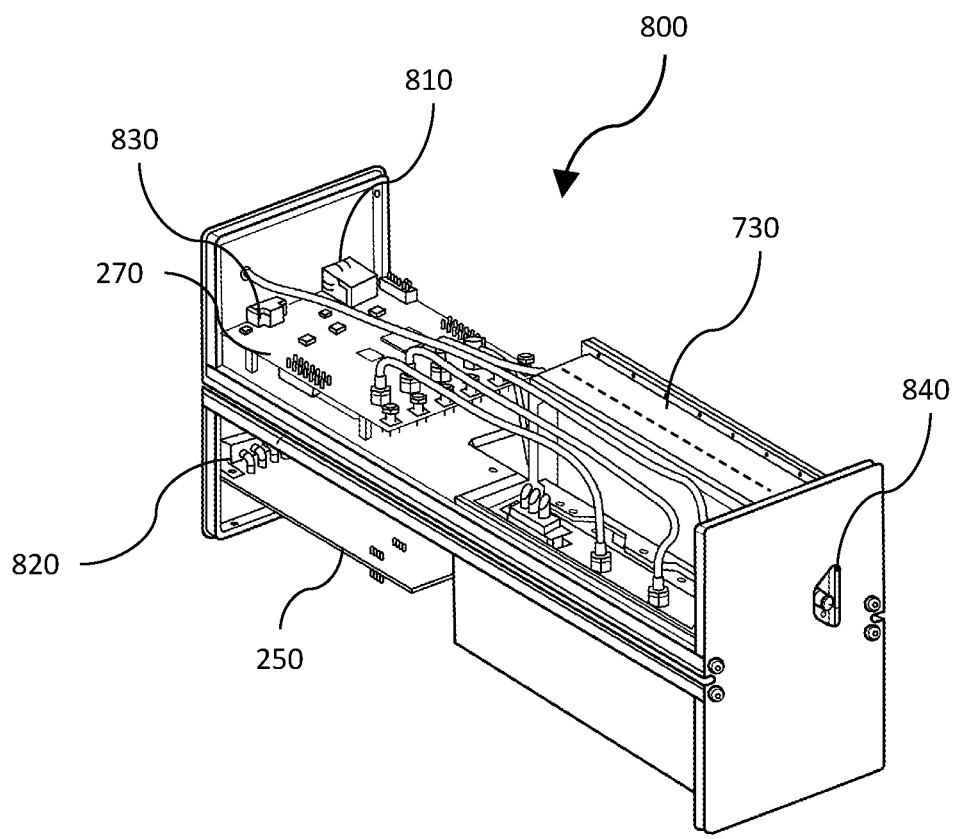
FIG. 8 is a simplified diagram illustrating modular power amplifier, in accordance with certain aspects of the present disclosure.

As shown in FIG. 8, an exemplary embodiment of a modular power amplifier 800 can include many of the components disclosed herein, allowing, for example, efficient replacement of damaged or upgraded modules. For example, the modular power amplifier 800 can include an RF input port 810, a power input port 820, a digital control port 830, and an RF output port 840. Such ports simplify the connections needed to operate and maintain the amplifier system.

Figure 9:
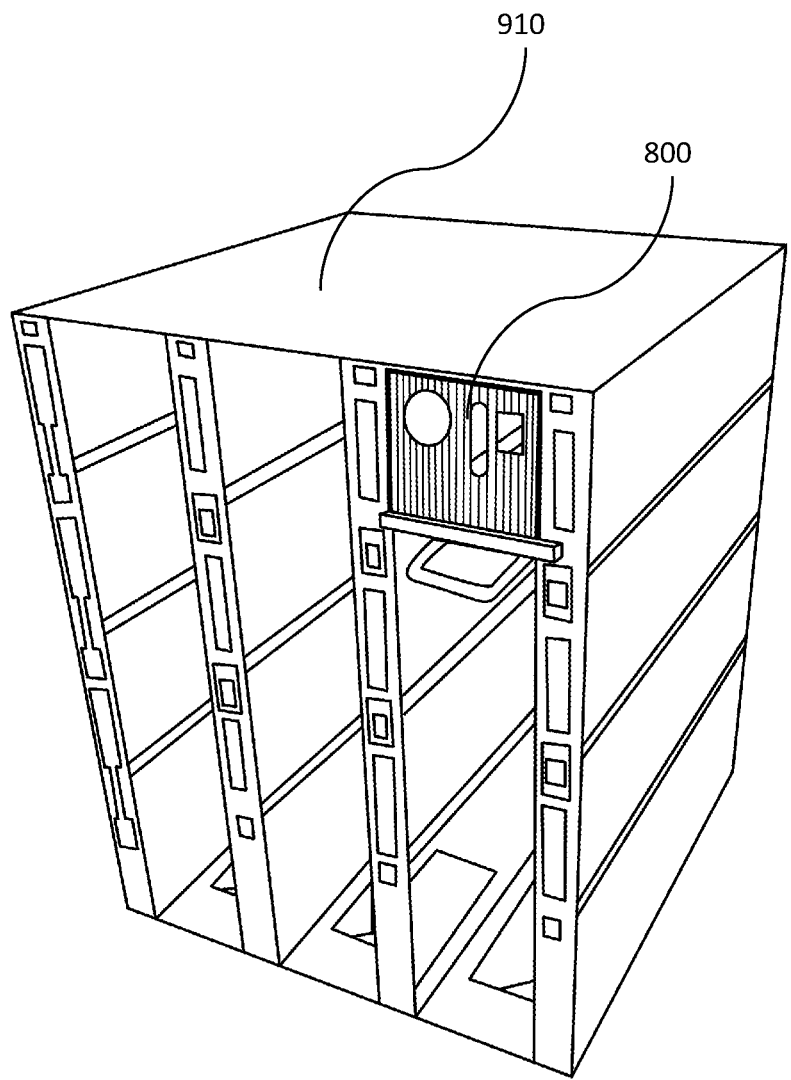
FIG. 9 is a simplified diagram illustrating a rack for multiple modular power amplifiers, in accordance with certain aspects of the present disclosure.

FIG. 9 illustrates an exemplary embodiment of a rack 910 suitable for holding one or more modular power amplifiers 800. The rack 910 can be a lattice-shaped structure configured to receive any number of modular power amplifiers. Rack 910 can include guides and spacers between installed modular power amplifiers to enable the proper alignment and spacing to enable various improves disclosed herein, such as wavelength separations between amplifiers or incorporating shielding into the structure of the rack for further EMI mitigation. For example, one implementation of the disclosed systems can include those having an RF generator configured to generate RF signals at a particular wavelength. The system can include amplifiers (such as may be held in rack 910) that can be configured to receive and amplify the RF signals. As mentioned previously, certain implementations can have the amplifiers separated from each other by at least approximately half of the wavelength to reduce EMI. As used herein, the term "approximately half of the wavelength," or the like, is understood to allow for some variation around the half-wavelength, but which still effectively mitigates EMI between adjacent amplifier components. For example, the separation can vary by up to 35% around the half-wavelength and still be considered within the scope of the present disclosure. As described in greater detail below, some implementations of the disclosed systems can include a power management system configured to control one or more of the amplifiers based on information received from various sensing circuits monitoring RF signal generation.

In some implementations, the separation between individual racks 910 comprising amplifiers can be spaced apart by a separation distance that is in a range between approximately 0.2 times the wavelength and about 10.0 times the wavelength of the signal amplified by the amplifiers. For example, the separation between individual racks 910 can be approximately 0.25 times the wavelength, 0.3 times the wavelength, 0.4 times the wavelength, 0.5 times the wavelength, 0.6 times the wavelength, 0.7 times the wavelength, 1.0 times the wavelength, 1.5 times the wavelength, 2.0 times the wavelength, 2.5 times the wavelength, 3.0 times the wavelength, 4.0 times the wavelength, 5.0 times the wavelength, 7.0 times the wavelength, 10.0 times the wavelength, or any separation therebetween. In other implementations, separations can be between approximately 2-18 inches or 3-7 inches. As discussed above, increasing the spacing separation between individual racks 910 can allow integration of antennas with the larger areas (e.g., horn antenna designs) with amplifiers which can provide larger antenna gain. Such systems can be useful to provide higher power with smaller number of antenna elements.

Figure 10:
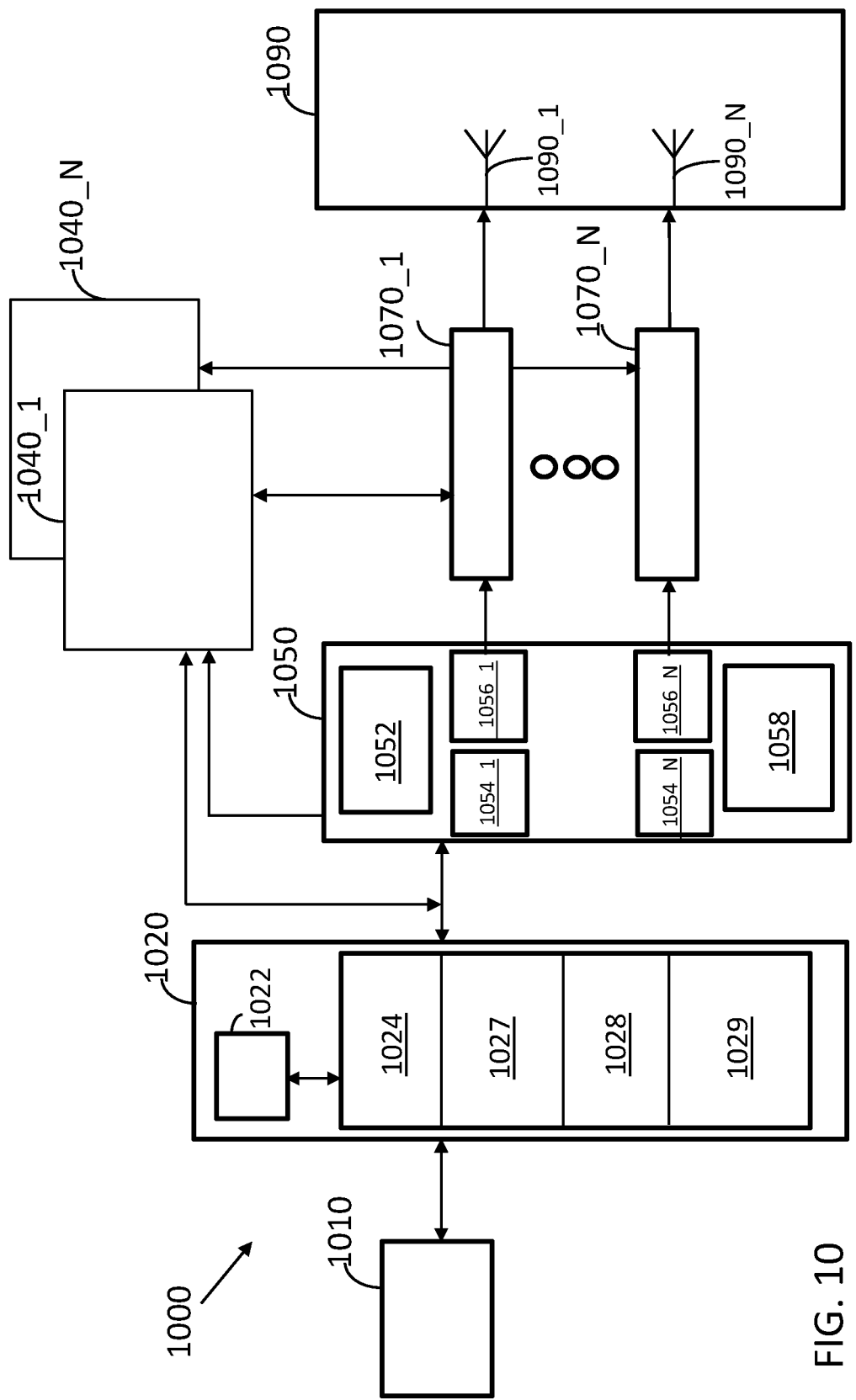
FIG. 10 illustrates an implementation similar to the system of FIG. 1, but with additional details provided for a number of components, in accordance with certain aspects of the present disclosure.

FIG. 10 illustrates an implementation similar to system 100 of FIG. 1, but with additional details provided for a number of components. For example, target detector 1010 can be similar to user input device 110, which was previously described as usable for selecting targets of the antenna array. Similarly, computer 1020 can be similar to computer 120, antenna 1090 (having individual antennas 1090_1 to 1090_N) can be similar to antenna array 190 and so on. Also, RF generator 1050 can be similar to RF FPGA 150, but with additional details shown in this implementation, such as including a direct digital synthesis (DDS) RF generator 1052, digital to analog convertors (DACs) 1054_1 to 1054_N, F connectors 1056_1 to 1056_N, and gate array 1058. Computer 1020 can be similar to mission computer 120, but herein further including CPU 1022 in communication with target classifier 1024, waveform LUT 1026, waveform selector 1028, and system power monitor 1029.

As used herein the notation "X_1 to X_N" describes a collection of elements X of any size 1 to N, including only 1. For clarity, in many locations only a reference is given to a single element (e.g., 1090_1), but such references should be understood to refer to any element in the collection and not necessarily specifically the first one.

The exemplary embodiment 1000 is illustrated as being augmented with a plurality of power management systems 1040_1 to 1040_N configured to provide the required voltages and currents to efficiently operate the amplifiers in the amplifier chains 1070_1 to 1070_N. In various implementations, the power management systems 1040_1 to 1040_N can comprise or be associated with a power distributing/sequencing system similar to the power sequencer 270. Individual power management systems 1040_1 to 1040_N can be configured to: (i) in response to receiving a signal from the RF generator 1050 provide appropriate bias voltages and/or currents to turn on the amplifiers in the corresponding amplifier chains 1070_1 to 1070_N prior to/synchronously with the arrival of the RF signal from the RF generator 1050, (ii) change the bias voltages and currents to the amplifiers based on a sensed characteristic (e.g., temperature, gate current or drain current), and/or (iii) reduce the bias voltages and currents to turn-off the amplifiers in the corresponding amplifier chains 1070_1 to 1070_N in response to absence of signal to be amplified or a sensed characteristic (e.g., temperature, gate current or drain current) being outside a range of values. In some implementations, the individual power management systems can be configured to automatically determine the voltages and currents required to turn-on/turn-off the amplifiers in the corresponding amplifier chains 1070_1 to 1070_N. In some implementations, the automatic determination can be made using a calibration routine performed prior to using the systems. In some implementations, the power management system can be configured to access computer memory to obtain historical data stored from prior operations of the system. The automatic determination can then be based at least partially on the historical data.

As discussed above, the plurality of power management systems 1040_1 and 1040_N can comprise sensors (e.g., current sensors) that can sense current values (e.g., drain and/or gate current values) of the individual amplifiers in the amplifier chains 1070_1 to 1070_N. The sensors can be similar to sensor 260 discussed above. The power management systems 1040_1 and 1040_N can be configured to sense the current values of the individual amplifiers in the amplifier chains 1070_1 to 1070_N intermittently (e.g., periodically). In some implementations, the power management systems 1040_1 and 1040_N can be configured to sense the current values of the individual amplifiers in the amplifier chains 1070_1 to 1070_N continuously. In various implementations, the output from the current sensor can be sampled using an analog to digital converter (ADC) and averaged over a number of samples (e.g., 128 samples, 512 samples, etc.) to obtain the sensed current value.

The sensed current value can be analyzed by the power management systems 1040_1 to 1040_N to determine an operational or a physical characteristic (e.g., temperature) of the individual amplifier. For example, a sensed current value above a first threshold current value when the amplifier is not turned on can be indicative of a defect in the amplifier or a defect in the circuit board on which the amplifier is mounted. As another example, a sensed current value above a second threshold current value when the amplifier is turned on but no signal to be amplified is provided to the input can be indicative of a defect in the amplifier or a rise in the temperature of the amplifier. As yet another example, a sensed current value above a third threshold current value when the amplifier is turned on and a signal to be amplified is provided to the input can be indicative of a defect in the amplifier or a rise in the temperature of the amplifier. Accordingly, the power management systems 1040_1 to 1040_N can be configured to compare individual amplifier current values to target amplifier current values to identify an amplifier state error. In response to determining that the amplifier current value of a particular amplifier has deviated from a target amplifier current value (e.g., first, second or third threshold values discussed above), the power management system controlling that particular amplifier is configured to determine the amount by which values of the voltages/current provided to the amplifier should be offset to achieve efficient operation of the amplifier and provide that offset value. In various implementations, one or more of tasks of correlating the sensed current values to a physical characteristic of the amplifier or determining the amount by which values of the voltages/current provided to the amplifier should be offset by to achieve efficient operation of the amplifier can be performed by the computer 1020 instead of the power management systems 1040_1 to 1040_N.

The target amplifier current values may be based upon several factors for optimal system operation. For example, the target amplifier current values may be calibration amplifier current values for specified temperatures. The target amplifier current values may be calibration amplifier current values to compensate for amplifier manufacturing process variations. The target amplifier current values may be calibration amplifier current values to compensate for voltage variations. The target amplifier current values may be calibration amplifier current values to compensate for radio frequency phase variations. The target amplifier current values may be historical performance amplifier current values. The historical performance amplifier current values may be used to identify amplifier degradation over time.

Figure 11:
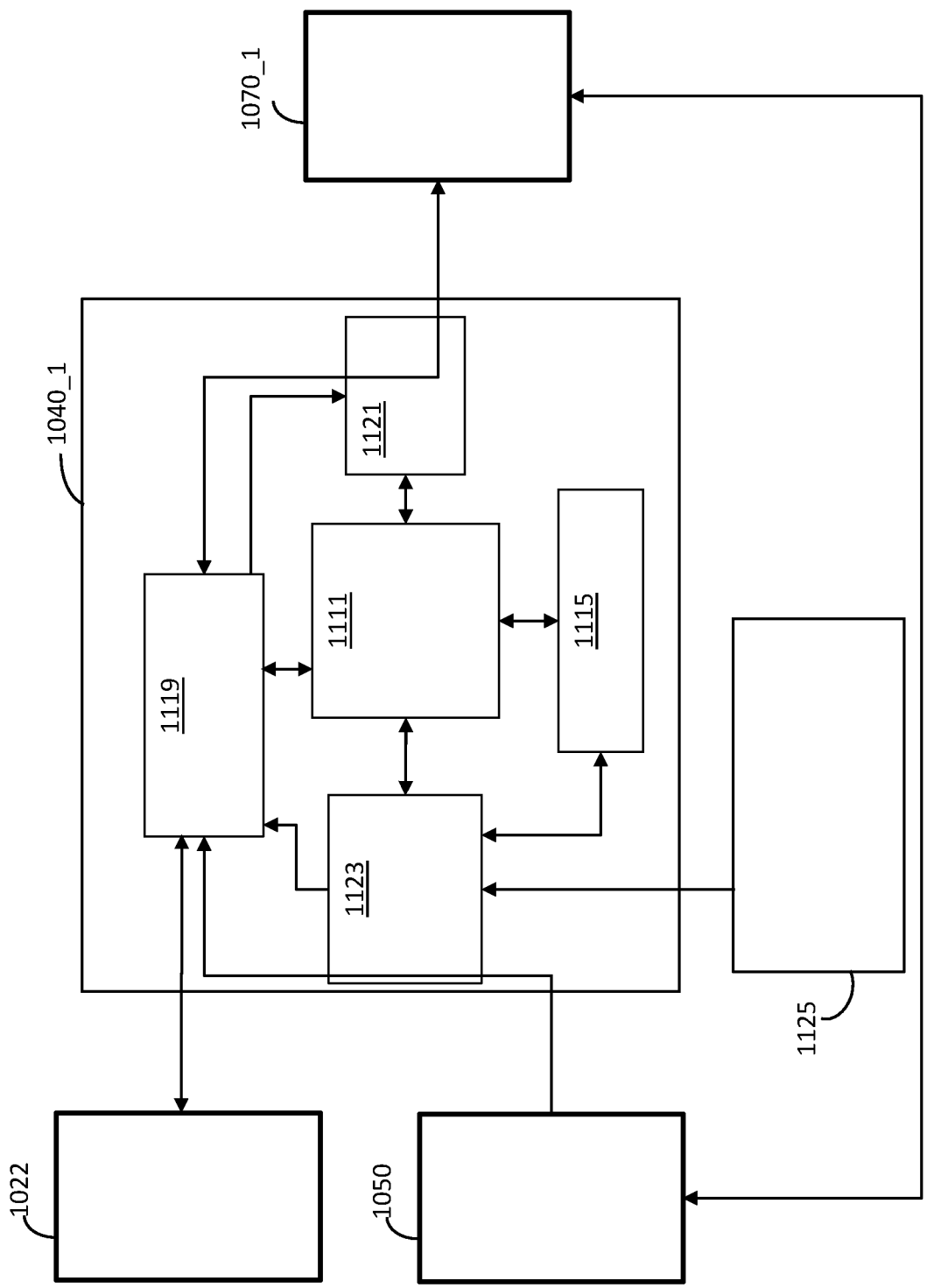
FIG. 11 illustrates an implementation of a power management system, in accordance with certain aspects of the present disclosure.

FIG. 11 illustrates an implementation of a power management system (e.g., 1040_1, but may apply to any of the power management systems). The power management system 1040_1 can include various functional sub-systems, such as an electronic processing system 1111, a control system 1115, a memory (not shown), a sensing system 1121, a power adapting system 1123, and an input/output system 1119. The various functional sub-systems can be integrated in a single housing or in separate housings. In implementations where the different functional sub-systems are integrated in separate housings, the separate housings can include processing electronics and communication systems to communicate and function properly. For example, in some implementations, the power adapting system 1123 and the sensing system 1115 can be integrated in a separate housing. In such implementations, the electronic processing system 1111 in cooperation with the control system 1115 and the memory can provide signals to the power adapting system 1123 to turn-on/turn-off the biasing voltages and currents to the amplifiers in response to receiving a signal from the RF generator 1050 indicating the start/end of the RF signal and/or receiving information from the sensors that one or more sensed parameters are out of a range of values.

The power management system 1040_1 can be implemented in, for example, a field programmable gate array (FPGA) or in a 5 mm×5 mm application specific integrated circuit (ASIC). The power management system 1040_1 can be configured to obtain information about the signals to be amplified and monitor various currents and voltages of the amplifier to optimize and control operating currents and voltages of the amplifier. The power management system 1040_1 can obtain the information about the signals to be amplified and the currents/voltages at various terminals of the amplifier in real-time or substantially in real-time. For example, the power management system 1040_1 can obtain the information about the signals to be amplified and the currents/voltages at various terminals of the amplifier in a time interval less than about 1 second, in a time interval greater than or equal to about 1 millisecond and less than about 1 second, in a time interval greater than or equal to about 1 second and less than about 10 seconds, in a time interval greater than or equal to about 10 seconds and less than about 30 seconds, in a time interval greater than or equal to about 30 seconds and less than about 1 minute and/or in a range defined by any of these values.

The power management system 1040_1 can provide several benefits including but not limited to increasing/optimizing power efficiency for a desired performance criterion. For example, consider that an amplifier in the amplifier chain 1070_1 being controlled by the power management system 1040_1 is operated in a high gain regime to provide a certain amount of RF output power. The power efficiency of that amplifier can be higher than a similar amplifier that is operated in a high gain regime to provide the same amount of RF output power but is not controlled by the power management system 1040_1. As another example, consider that an amplifier in the amplifier chain 1070_1 controlled by the power management system 1040_1 is operated to provide a certain amount of gain and linearity. The power efficiency of that amplifier can be higher than a similar amplifier that is operated to provide the same amount of gain and linearity but is not controlled by the power management system 1040_1. The use of the power management system 1040_1 can also reduce direct current (DC) power consumption during operation of an amplifier as compared to direct current (DC) power consumption by an amplifier driven without a power management system 1040_1. The power management system 1040_1 can improve linearity of an amplifier, help in automatic calibration of an amplifier over temperature, voltage and process variations, and/or have the ability to auto calibrate for phased array applications.

The electronic processing system 1111 can comprise a hardware processor that is configured to execute instructions stored in the memory which will cause the power management system 1040_1 to perform a variety of functions including, but not limited to, turning on/off or reduce voltages/currents provided to various terminals of an amplifier in response to detecting that the signal to be amplified is turned on/off or sensing individual amplifier current values and change the values of different voltages and currents in response to the deviations of the sensed current values from target values.

The input/output system 1119 can be configured to provide wired/wireless connection with external devices and systems. For example, the input/output system 1119 can comprise an Ethernet port (e.g., a Gigabit Ethernet (GbE) connector) that provides connection to the computer 1020 and/or a router, one or more connectors that provide connection to the RF signal generator 1050, a connector that provides connection with an external power supply, a plurality of connectors that provide voltages/currents to one or more amplifiers, a plurality of connectors that can receive voltage/current information from the one or more amplifiers, and connectors that provide connection with a user interface (e.g., a display device). In various implementations, the input/output system 1119 can comprise a command-and-control link to receive messages from the RF generator 1050 and/or computer 1020.

The input/output system 1119 can be configured to receive, as input, a signal/trigger/information from the RF signal generator 1050 and use the information from this input to determine the voltages and current for an amplifier in the amplifier chain 1070_1. As discussed above, the input received from the RF signal generator can be a trigger that conveys information that the RF signal will be turning on and causes the power management system 1040_1 to start the power sequencing process and provide appropriate voltages and/or currents to bias the amplifiers in the corresponding amplifier chain 1070_1 prior to the arrival of the RF signal. For example, the input from the RF signal generator can be a pulse enable signal which is high when the RF signal is on and low when the RF signal is off. In various implementations, the input from the RF signal generator 1050 can be representative of the waveform being output by the DAC 1054_1 of the RF generator 1050. In some implementations, the input can include instructions and/or settings to power on the power management system 1040_1, to power up an amplifier in the amplifier chain 1070_1, and other data to operate the power management system 1040_1 and an amplifier in the amplifier chain 1070_1.

The input/output system 1119 can comprise a communication system configured to communicate with external devices and systems. For example, the input/output system 1119 can comprise Ethernet connectivity to send information including but not limited to amplifier health information, and efficiency statistics to the computer 1020. Ethernet connectivity can also be utilized in synchronizing an array of power management systems in phased array applications. The input/output system 1119 can include connectors that can be configured to provide voltages/currents to at least one terminal of an amplifier in the amplifier chain 1070_1 to 1070_N. For example, the voltages and currents required to bias at least one of the gate, source and/or drain terminal of an amplifier in the amplifier chain 1070_1 can be provided through the output ports of the power management system 1040_1. The power management system 1040_1 can be configured to provide bias voltage and/or current to a plurality of amplifiers. For example, the power management system 1040_1 can be configured to provide bias voltage and/or current to two, four, six or more amplifiers.

The sensing system 1121 can be configured to sense current values at one or more terminals of the amplifier as discussed above. In various implementations, the sensing system 1121 comprises at least one current sensor and an analog to digital converter configured to sample and average the output of the current sensor to obtain a sensed current value. In various implementations, the current sensor need not be integrated with the other components of the sensing system 1121 and/or the other sub-systems of the power management system 1040_1. Instead, the current sensor can be integrated with the amplifier. The number of current sensors can vary based on the number of amplifiers being controlled by the power management system 1040_1 and the number of currents that are being monitored. For example, if the power management system 1040_1 is configured to control four distinct amplifiers and it is desired to monitor the drain current of each of the four separate amplifiers, then the power management system 1040_1 can include four current sensors configured to monitor the drain current of each of the four distinct amplifiers.

The power adapting system 1123 can be configured to convert power from an external power supply 1125 (e.g., an AC power line, a battery source, a generator, etc.) to voltage and current waveforms required for operating the amplifiers being controlled by the power management system 1040_1. For example, in various implementations, the power adapting system 1123 is configured to convert a 60V DC bus and generate appropriate voltage and current inputs for the various terminals of the amplifier. In some implementations, the power adapting system 1123 may be configured to convert an incoming AC power line to DC power (e.g., to about +80 Volts DC). The power adapting system 1123 is configured to step down the converted DC voltage to appropriate voltages for the amplifier (e.g., in a voltage range between about +45 Volts and +70 Volts high voltage Gallium Nitride power amplifiers) through DC/DC converters. The stepped down voltages are provided to the various terminals of the amplifier (e.g., gate, drain, and/or source) in a sequence as discussed above in response to receiving a signal from the RF signal generator 1050 and/or the computer 1020 that the signal to be amplified is turned on/being turned on. In various implementations, the power adapting system 1123 comprises a "power gating" feature where the voltage to the gate terminal of the amplifier is raised and lowered to turn on/turn off the power amplifier in response to the turning on and turning off the RF signal. For example, in an implementation of the amplifier chain 1070_1 comprising a GaN power amplifier, the power management system 1040_1 can toggle the gate voltage between about −5V (pinch off or turn off) and about −2.5V (saturation or turn on) at a frequency greater than or equal to 1 kHz and less than or equal to about 500 MHz. For example, the gate voltage can be toggled between pinch off and saturation at a rate greater than or equal to about 10 MHz and less than or equal to about 100 MHz. Without any loss of generality, the power management system 1040_1 can be configured to turn-on and turn-off the amplifier in between pulses of a pulsed waveform. This can advantageously allow heat to dissipate from the amplifier in between pulses thereby reducing the rate at which the amplifier heats up and increase lifetime. Turning on and off the amplifier in between pulses of a pulsed waveform can also advantageously increase the power efficiency of the amplifier.

The control system 1115 can be configured to control and/or manage various functions and processes of the power management system 1040_1. For example, the control system 1115 independently or in co-operation with the computer 1020 and/or the RF generator 1050 can control the order in which the voltage and current levels at various terminals of the amplifier are changed to power up/down the amplifier. As another example, the control system 1115 independently or in co-operation with the computer 1020 and/or the RF generator 1050 can control the raising and lowering of the voltage/current levels at the gate terminal of the amplifier synchronously with the incoming signal to be amplified. As yet another example, the control system 1115 independently or in co-operation with the computer 1020 and/or the RF generator 1050 can control the timing of turning on the various amplifiers in the amplifier chains 1070_1 to 1070_N.

Figure 12:
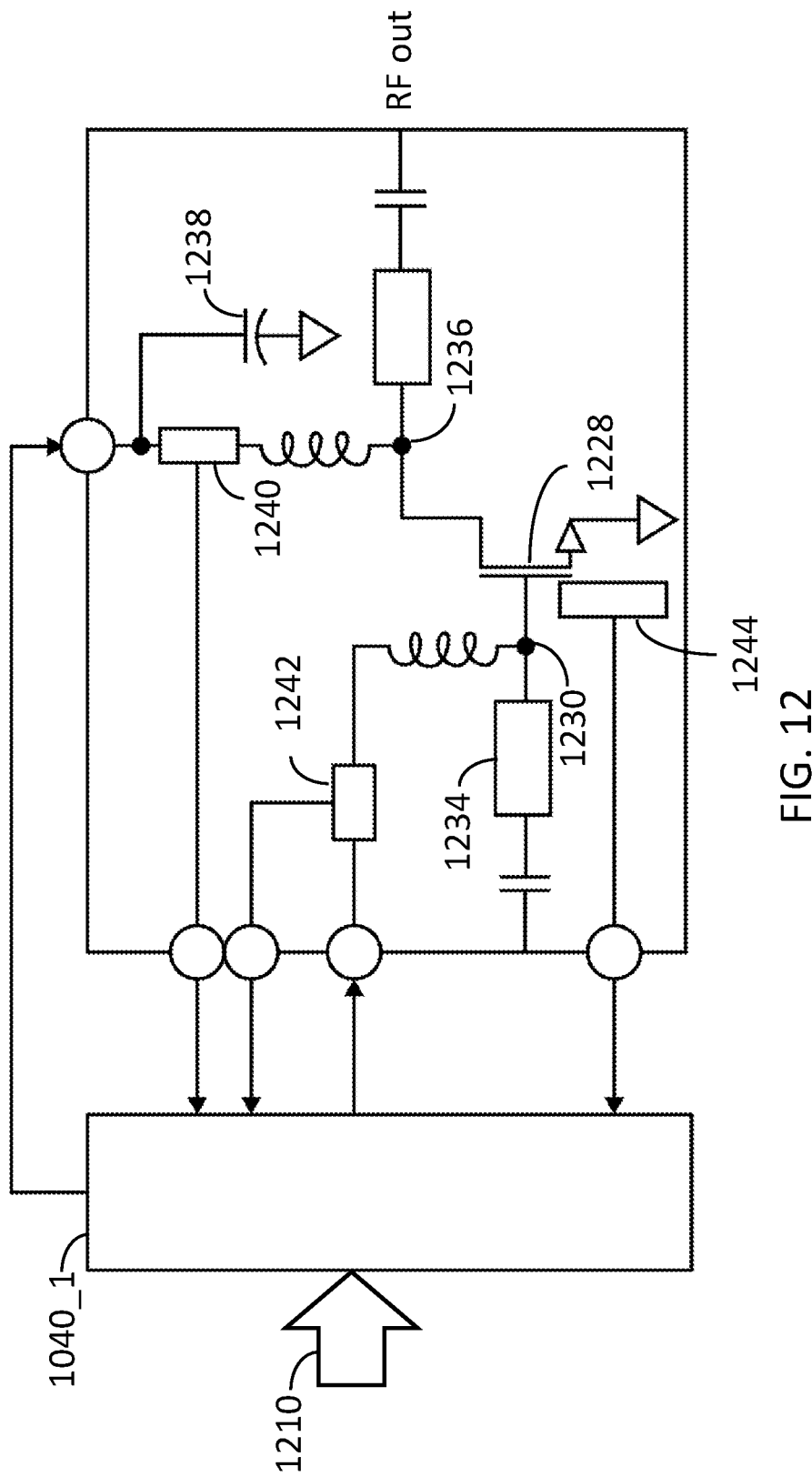
FIG. 12 is a schematic illustration including an amplifier that is part of an amplifier chain controlled by a power management system, in accordance with certain aspects of the present disclosure.

FIG. 12 is a schematic illustration including an amplifier 1228 that is part of amplifier chain 1070_1 controlled by the power management system 1040_1. As discussed above, the power management system 1040_1 can be configured to use the information (RF data 1210) about the signal to be amplified to adjust/tune bias voltages and currents required to power up/down one or more amplifiers in the amplifier chain 1070_1 to improve various figures of merit (e.g., power efficiency, linearity, etc.) of the one or more amplifiers in the amplifier chain 1070_1. The amplifier 1228 is a FET amplifier having a gate terminal 1230 and a drain terminal 1232. As discussed above, the power management system 1040_1 is configured to provide voltage/current to the gate terminal 1230 and the drain terminal 1232 of the amplifier as well as adjust the voltage/current levels at the gate terminal 1230 and the drain terminal 1232 based on information regarding the incoming signal and/or information regarding the temperature and other physical characteristics of the amplifier 1228.

The signal to be amplified can be input to the gate terminal 1230 via an input matching circuit 1234. The amplified signal can be output from the drain terminal 1232 via an output matching circuit 1236. To ease the burden on the power adapting system 1223, one or more storage capacitors 1238 are placed near the drain terminal 1232 of the amplifier 1228. The illustrated implementation comprises a single storage capacitor 1238. The storage capacitors can have a capacitance value between about 700 microfarads and 2000 microfarads. The presence of the storage capacitors 1238 are advantageous in high power applications and/or applications in which the signal has a high duty cycle. In implementations comprising a plurality of capacitors, the plurality of capacitors in arranged in parallel. As discussed above, the power management system 1040_1 comprises a plurality of current sensors 1240 and 1242 that are configured to sense/monitor drain and gate current respectively. The current sensor 1240 configured to monitor/sense drain current can be positioned downstream of the storage capacitor 1238 as shown in the illustrated embodiment or upstream of the storage capacitor 1238 in other embodiments. The power management system 1040_1 can also comprise a temperature sensor 1244 configured to sense/monitor the ambient temperature in the vicinity of the amplifier 1228. For example, the temperature sensor 1244 can be configured to measure the temperature of the circuit board on which the amplifier 1228 is mounted.

The power management system 1040_1 can be configured to protect the amplifiers from damage. The power management system 1040_1 can be configured to monitor voltages and/or currents at various terminals of the amplifier and turn-off the amplifier if the current and/or voltage exceeds a certain limit. For example, the power management system 1040_1 can be configured to turn off an amplifier in the amplifier chain 1070_1 if the drain current of that amplifier exceeds a preset threshold. The threshold drain current for the various amplifiers controlled by the power management system 1040_1 can be programmed and stored in a memory accessible by the power management system 1040_1. The threshold drain current can be different when the RF signal is on and off. As another example, the power management system 1040_1 is configured to turn-off the amplifier if the rate of increase of the drain current of an amplifier during power up sequence is below a threshold rate. The threshold rate of increase of the drain current for the various amplifiers controlled by the power management system 1040_1 can be programmed and stored in a memory accessible by the power management system 1040_1. In various implementations, the power management system 1040_1 can be configured to monitor the duration of time an amplifier is on and turn off the amplifier if an amplifier is on for an amount time greater than a preset amount of time even if the RF signal is on. The preset amount of time can be programmed and stored in a memory accessible by the power management system 1040_1. In various implementations, an input switch can be provided in the input signal path of the amplifier. In such implementations, the power management system 1040_1 can be configured to open the input switch and disconnect the RF signal from the input to the amplifier if the voltage, current and/or duration of time the amplifier is on exceeds a limit. In various implementations, a load switch can be provided in the drain path of the amplifier. In such implementations, the load switch can be opened to disconnect the drain and prevent damage to the amplifier if the drain current exceeds a limit.

The bias voltage/current of an amplifier (e.g., a GaN power amplifier) that optimizes the power efficiency of amplifier can vary based on the device temperature. Thus, the power efficiency of an amplifier can degrade from an optimum power efficiency as the temperature of the amplifier changes. Without relying on any particular theory, the temperature of the amplifier can increase over the duration of time that the amplifier is in use. Thus, it is advantageous to intermittently obtain a measurement/estimate of the temperature of the amplifier during use and adjust the bias voltage/current to optimize power efficiency and/or other figures of merit of the amplifier. The bias voltage/current that optimizes power efficiency can also be affected due to degradation in the device performance due to defects during manufacturing, aging or a defect in the circuitry surrounding the amplifier.

Figure 13:
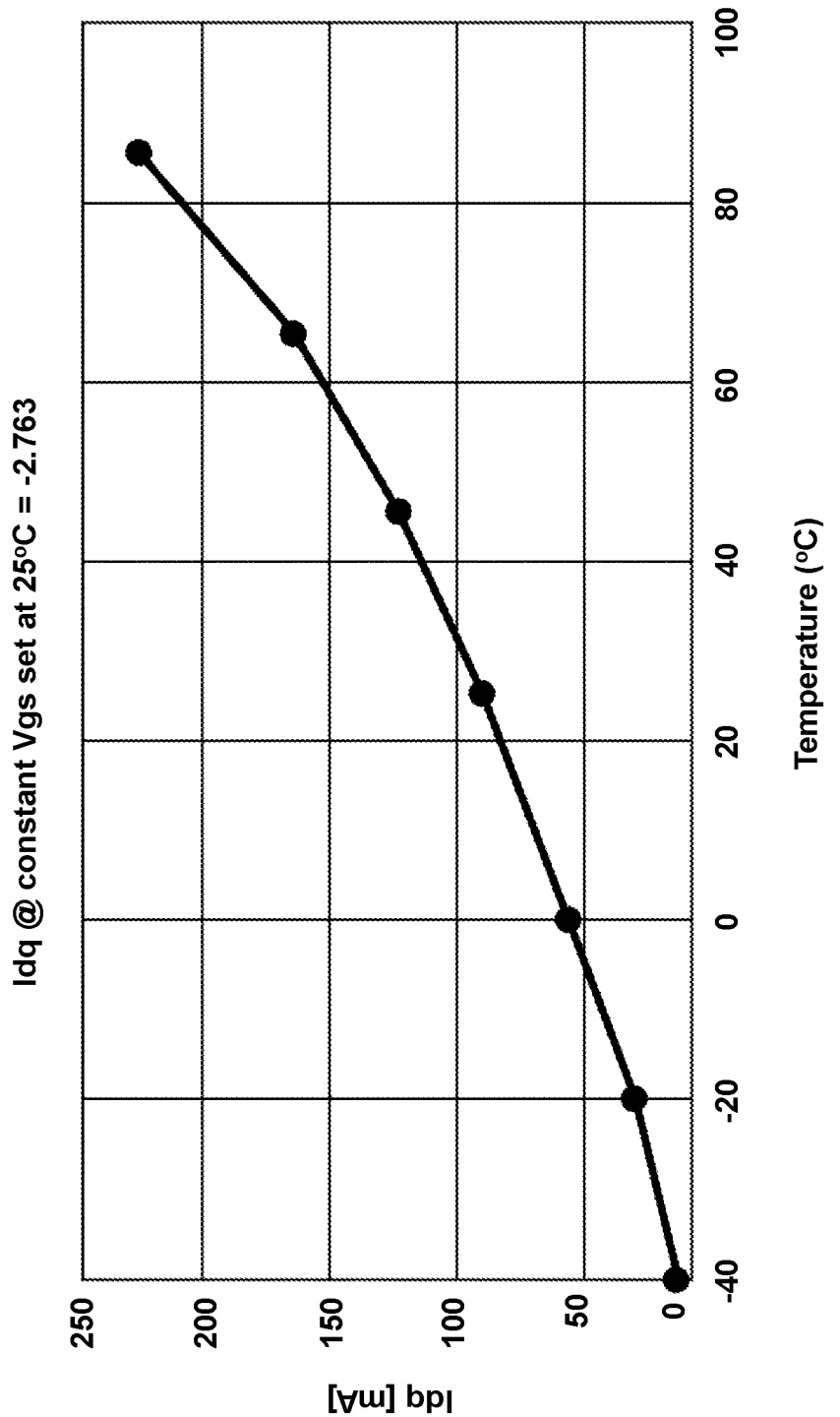
FIG. 13 illustrates an exemplary correlation between the drain current and the device temperature for an implementation of a FET amplifier, in accordance with certain aspects of the present disclosure.

FIG. 13 illustrates an exemplary correlation between the drain current and the device temperature for an implementation of a FET amplifier. While the temperature sensor 1244 in FIG. 12 may provide information regarding the ambient temperature around the amplifier 1228. In many implementations, it may not be practical to use a temperature sensor to obtain an estimate of the device temperature of the amplifier 1228. However, the drain current can be correlated to the device temperature of the amplifier 1228 and can be used to measure the device temperature of the amplifier 1228. In the example of FIG. 13, the embodiment of the FET amplifier is biased at a gate voltage of –2.763V and the drain current changes from about a few milliamps to about 225 milliamps as the temperature of the embodiment of the FET amplifier rises from about 40 degrees Celsius to about 85 degrees Celsius. The variation of the drain current versus temperature can be different when the biasing gate voltage is changed.

The drain current can also provide an indication of a degradation in the performance of the amplifier 1228 as a result of defects due to manufacturing/aging or a defect in the circuitry surrounding the amplifier. Thus, adjusting the biasing voltages/currents based on measuring the drain current can advantageously aid in optimizing power efficiency and other figures of merit of the amplifier 1228. The drain current can be obtained under DC bias condition when the signal to be amplified is absent, when the signal to be amplified is present and/or in between signal pulses. For example, in some implementations, the sensor 1240 can be configured to sense the drain current continuously or almost continuously. As discussed above, analog-to-digital converters in the power management system 1040_1 sample the sensed current. A measurement of the drain current is obtained by averaging over a plurality of samples of the sensed current. The electronic processing system 1111 can be configured to correlate the measured drain current to the device temperature of the amplifier 1228. The electronic processing system 1111 can be configured to correlate the measured drain current to the device temperature of the amplifier 1228 using algorithms and/or look-up-tables (LUTs).

As the device temperature of the amplifier 1228 changes, the biasing gate voltage that would achieve power efficient operation can change. Accordingly, in many implementations, the electronic processing system 811 of the power management system 1040_1 can be further configured to change the biasing gate voltage based on the device temperature obtained from the measured gate current. The electronic processing system 811 can be configured to obtain the amount by which the gate voltage should be changed (also referred to herein as gate offset voltage) using algorithms and/or look-up-tables (LUTs). The gate offset voltage can be in a range between about 1 mV and about 500 mV. In various implementations, the signal to be amplified is turned off before changing the gate voltage by the offset amount. In some implementations wherein the signal to be amplified comprises pulses, the gate voltage is changed by the offset amount in the time interval between pulses. In some implementations, the gate voltage is changed by the offset amount when the signal to be amplified is on.

Figure 14:
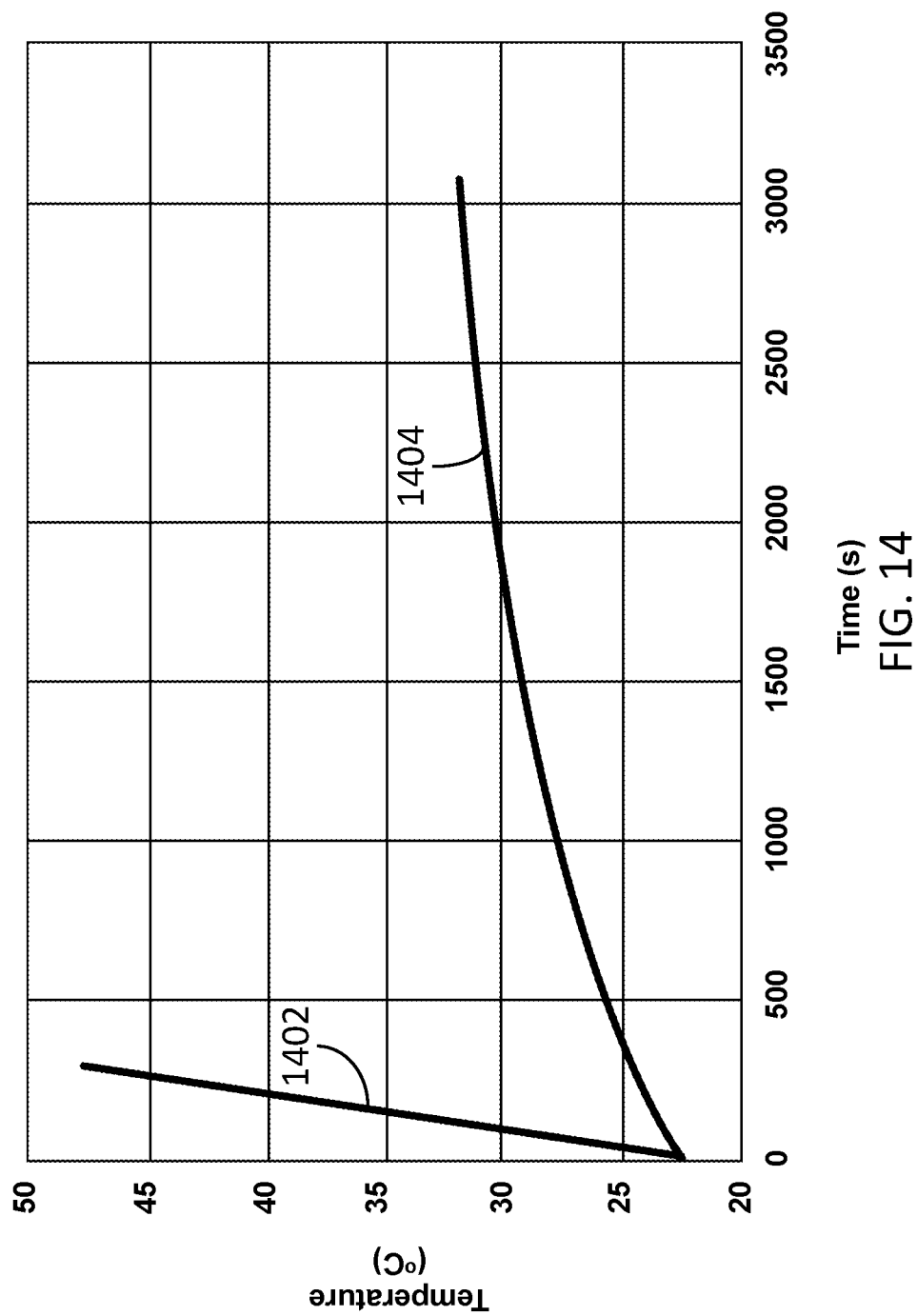
FIG. 14 illustrates an exemplary reduction in temperature due to an adjustment in gate bias voltage, in accordance with certain aspects of the present disclosure.

FIG. 14 illustrates an exemplary reduction in temperature due to an adjustment in gate bias voltage. In addition to optimizing power efficiency based on device temperature and/or achieving a desired power efficiency at different temperatures, the power management system 1040_1 can also help in preventing a rapid increase in the device temperature by adjusting the gate bias voltage as the drain current changes to maintain an optimal gain and/or power efficiency. As depicted in FIG. 14, an implementation of an amplifier controlled by the power management system 1040_1 can be operated in two conditions. In both the operating conditions, the bias voltage to the gate terminal of the amplifier can be turned on a short time before a RF signal is input to the amplifier and turned off a short time after the RF signal is turned off. For example, the gate bias voltage can be turned on/off at a duty cycle of 1%. However, in the first operating condition the gate bias voltage is maintained at a constant voltage, while in the second operating condition the gate bias voltage is changed as the drain current changes.

The effect of changing the gate bias voltage with the drain current not only increases/maximizes the gain provided by the amplifier over time but also prevents a rapid increase in the temperature of the amplifier over time. This is illustrated by curve 1402 exhibiting a rapid rise in the temperature of an amplifier over time when operated in the first operating condition and a curve 1404 exhibiting a gradual rise in the device temperature of an amplifier over time when operated in the second operating condition. As noted from curve 1402, the temperature of the amplifier can increase from about 22 degrees Celsius to about 48 degrees Celsius in less than 500 seconds when the amplifier is operated in the first operating condition. In contrast, the temperature of the amplifier increases gradually from about 22 degrees Celsius to about 32 degrees Celsius in about 3000 seconds when the amplifier is operated in the second operating condition.

Accordingly, systems including amplifiers controlled by a power management system 1040_1 that is configured to turn on/off the amplifier based on the presence/absence of the signal to be amplified as well as adjust the gate bias voltage based on the monitored drain current can operate efficiently and/or provide nearly constant gain at a wide range of temperatures (e.g., between about −20 degrees Celsius and about 90 degrees Celsius). Such systems can also operate without the need for large and/or expensive cooling systems. In some embodiments of the systems disclosed herein, amplifiers controlled by a power management system 1040_1 can be configured to turn on/off the amplifier based on the presence/absence of the signal to be amplified as well as adjust the gate bias voltage based on the monitored drain current can function without any cooling systems, such as for example, electrical or electro-mechanical cooling systems.

Figure 15:
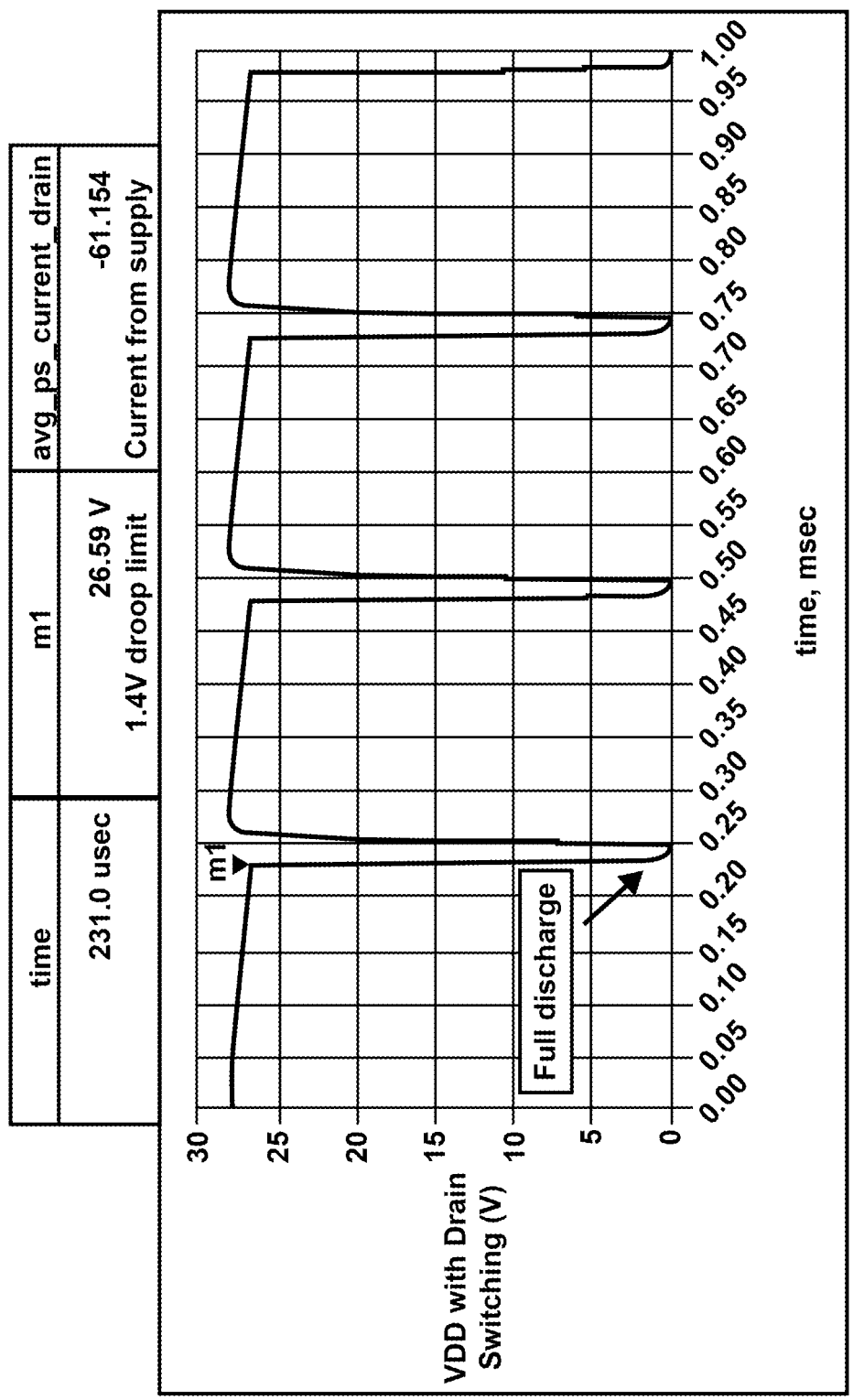
FIG. 15 illustrates an example of currents required to charge storage capacitors for amplifiers utilizing drain switching, in accordance with certain aspects of the present disclosure.

FIG. 15 illustrates an example of currents required to charge storage capacitors for amplifiers utilizing drain switching. As opposed to drain switching, another advantage of synchronizing the turning on/off the bias voltage to the gate terminal with the turning on/off the input signal is an increase in power efficiency. As discussed above, a storage capacitor 1238 may be provided near the drain terminal of the amplifier 1228 in various implementations. Depending on the pulse width and duty cycle requirements, the storage capacitor 1238 can have a large capacitance value (e.g., between 700 F and 2000 F). If the drain current is turned on/off synchronously with the input signal, a large amount of energy is required to charge the storage capacitor 1238.

Figure 16:
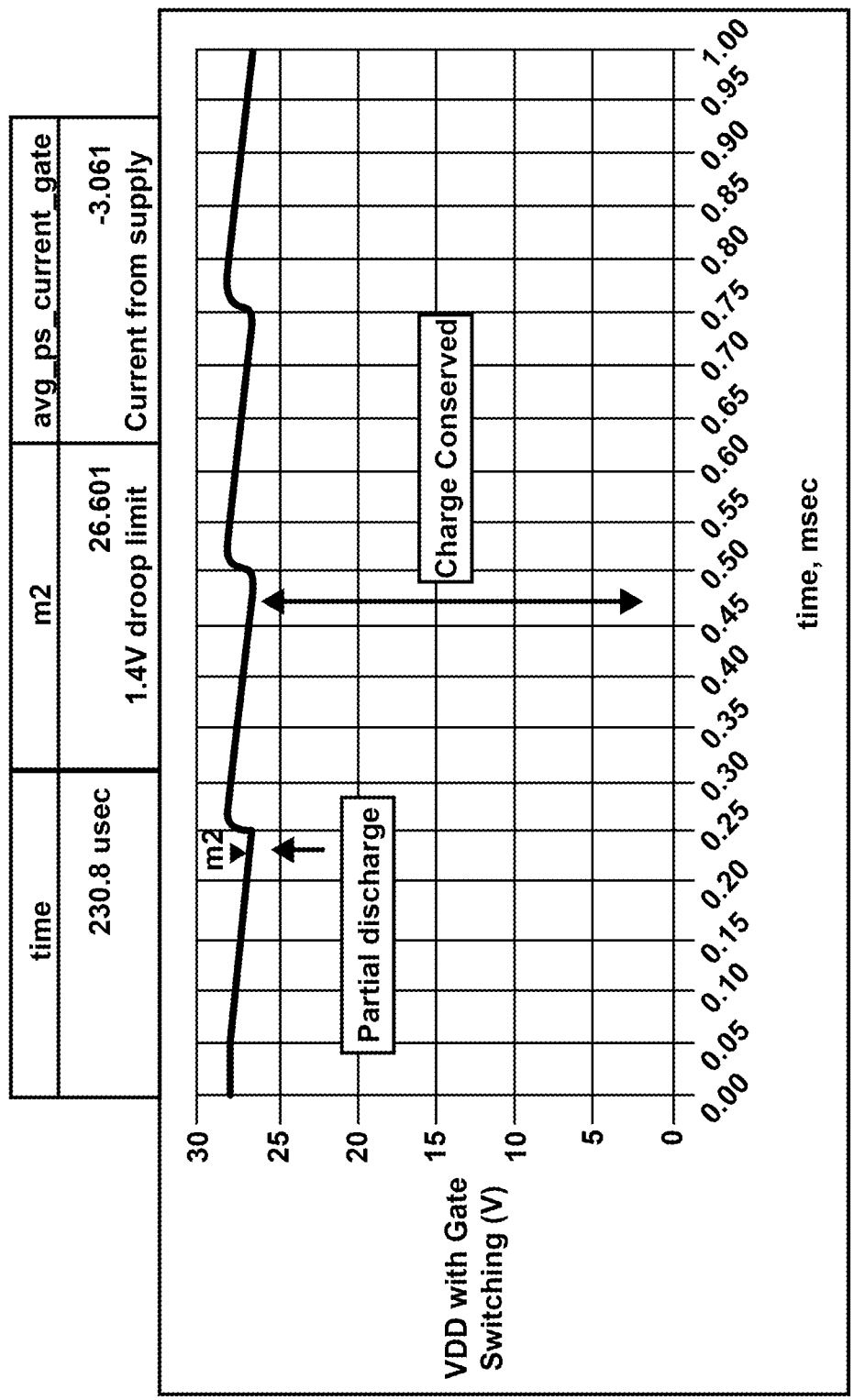
FIG. 16 illustrates an example of currents required to charge storage capacitors for amplifiers utilizing gate switching, in accordance with certain aspects of the present disclosure.

FIG. 16 illustrates an example of currents required to charge storage capacitors for amplifiers utilizing gate switching. In contrast, the capacitors near the gate terminal have lower capacitance values and the energy required to charge those capacitors can be between 10-20 times lower than the energy required to charge the storage capacitor 1238. Accordingly turning on/off the gate bias voltage (referred to herein as gate switching) instead of modulating the drain current/voltage (referred to herein as drain switching) can advantageously increase power efficiency of the amplifier.

Figure 17:
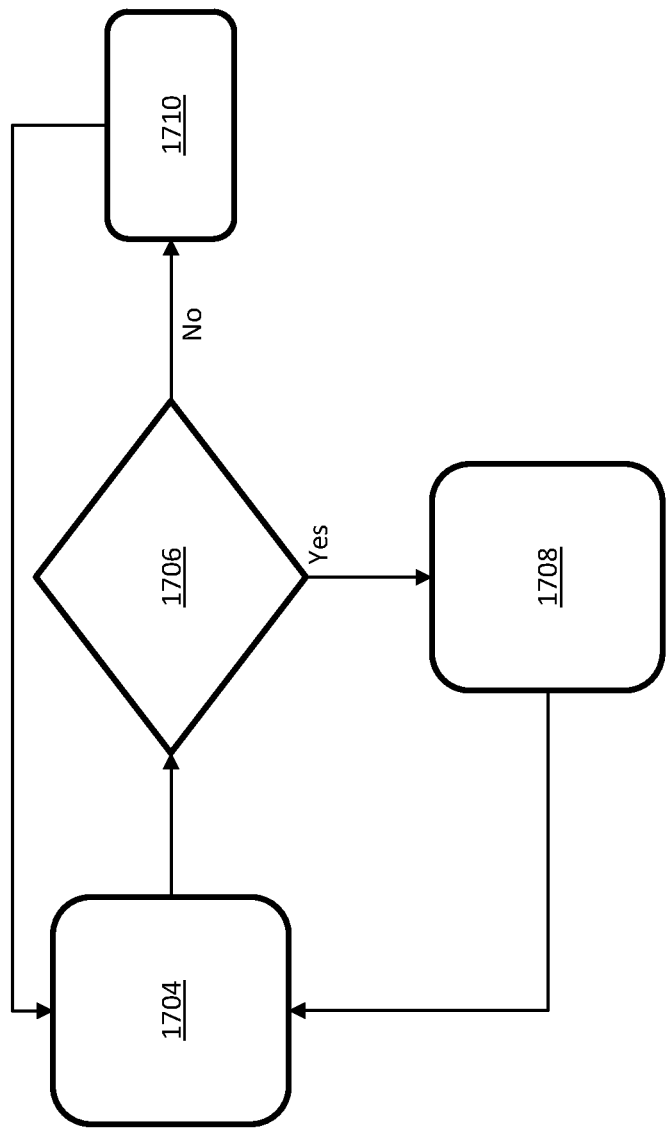
FIG. 17 illustrates a flow chart of exemplary operations for current sensing performed by the power management system, in accordance with certain aspects of the present disclosure.

FIG. 17 illustrates a flow chart of exemplary operations for current sensing performed by the power management system 1040_1. The drain and/or gate current from the amplifier can be monitored as shown in block 1704. As discussed above, the drain and/or gate current can be monitored using the sensing system 1121. The drain and/or gate current can be sensed continuously or intermittently (e.g., periodically). As discussed above, the sensed current can be sampled and averaged to obtain a measurement of the current. The current can be correlated to a temperature as discussed above. In various implementations, a range for the drain and/or gate current defined by an upper current threshold value and a lower current threshold value can be provided for various gate bias voltages. For a given gate bias voltage, the power efficiency of the amplifier is optimized if the drain and/or gate current is within the provided current range. Accordingly, if the measured current is different from a threshold value (upper current threshold or lower current threshold) as shown in block 1706, then the gate bias voltage can be changed as shown in block 1708. The power management system 1040_1 can change the gate bias voltage when the incoming signal is turned off or in-between pulses of the incoming signal. Otherwise, the operation can continue as shown in block 1710.

Figure 18:
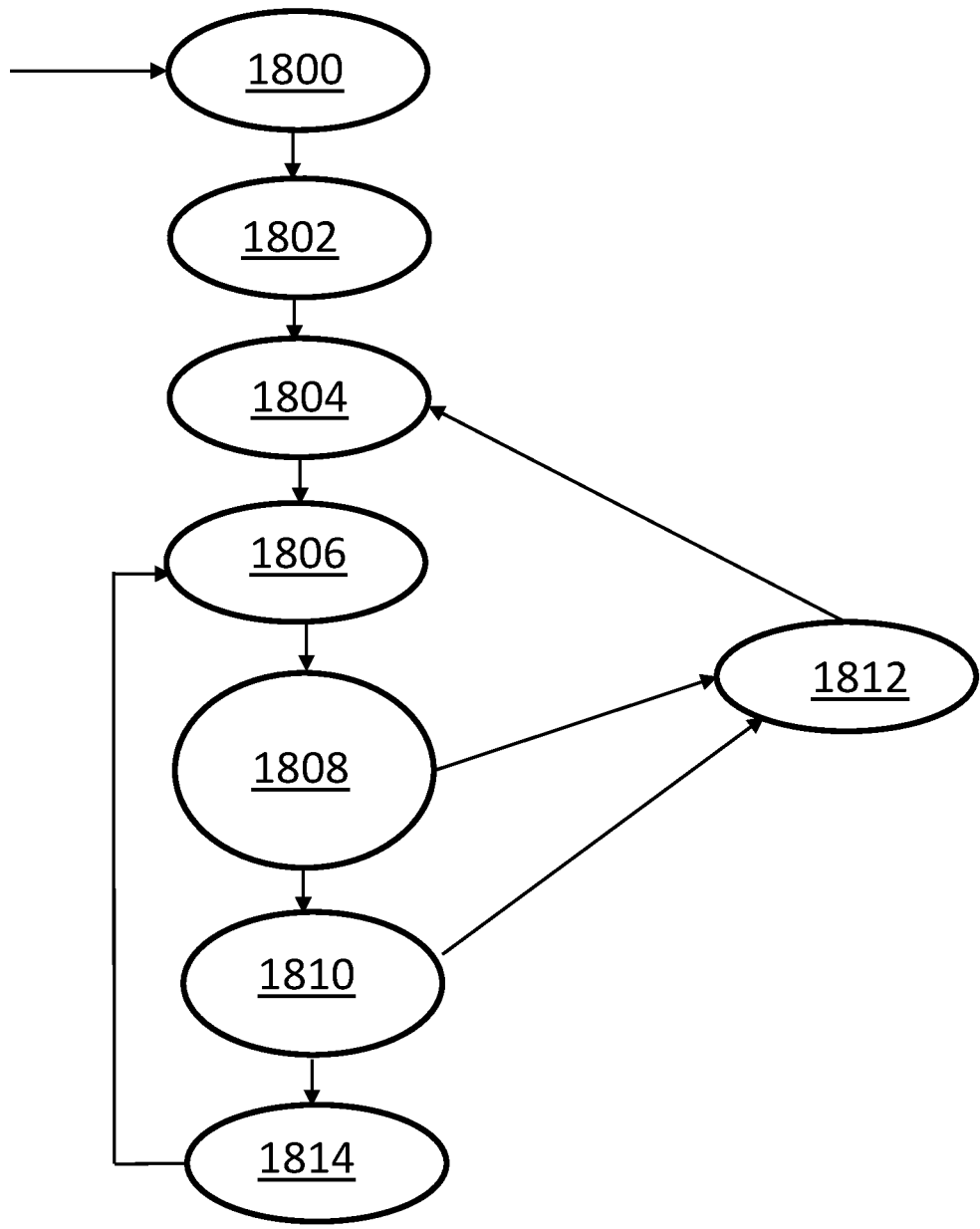
FIG. 18 illustrates an exemplary process for monitoring and tuning an amplifier, in accordance with certain aspects of the present disclosure.

FIG. 18 illustrates an exemplary process for monitoring and tuning an amplifier. A reset command can be received to commence an initialization operation 1800. The digital-to-analog converter can be initialized 1802. The initialization can include setting the voltage range of the DAC to appropriate output values for an amplifier being controlled, such as +/−5V.

Once the DAC voltage is set, an idle state 1804 can be entered. The idle state can be maintained until a tune command is received. A tune command can invoke a DAC prepare state 1806, where the voltage can be set to a specified level, such as −5V. A sensor calibration state 1808 can then be entered. In one embodiment, the sensor can be calibrated for a zero amp voltage offset. The offset can be subtracted from incoming samples at the analog-to-digital converter interface that can receive a current sense signal from a current sensor, such as one that may be part of sensing system 1121. If the offset is less than a threshold, an error state 1812 can be entered. Otherwise, a tune state 1810 can be entered. In this state, a new bias voltage (Vg) can be applied as an offset to direct the current sense signal to the desired value. If the DAC is maxed out, the error state 1812 can be entered. Otherwise, a completion state 1814 can be entered to determine whether processing should return to state 1806 to try to obtain an improved current sense signal.

The operations of FIG. 18 may be substituted with other approaches to establish an optimal current range. For example, the current range can be experimentally tested ahead of time and manually programmed or hard coded into the system. The system can also use machine learning or artificial intelligence techniques to find the optimal current. In other embodiments, signals are fed back into the tuning algorithm instead of just the current. Other signals include the RF output signal 420. A coupler can be used to determine the RF output level. For example, a bias voltage may be applied, a test RF signal is sent, which is read through the coupler into the RF signal generator 1050 [in FIG. 11]. This procedure is repeated until an optimal saturated RF power output value is obtained. Different optimization criteria are available, such as optimize for power out, such as to achieve 3 dB into power amplifier saturation. Another possible criterion can be to optimize for linearity, such that the RF power is in the linear range. In one embodiment, a pre-programmed voltage bias can be used and then voltage adjustments, e.g., 1, 5, or 10 mV, above and below the pre-programmed voltage can be used until the optimal voltage is achieved.

The RF output power can be tracked by the coupler and this information is relayed to the power management system 1040_1. As the RF power out for a given bias voltage or current for a given bias voltage starts to drop, the power management system 1040_1 recognizes that the amplifier is degrading. The amount of degradation can be mapped to the lifetime of the amplifier. Reports on amplifier state can be periodically issued by the power management system 1040_1.

Figure 19:
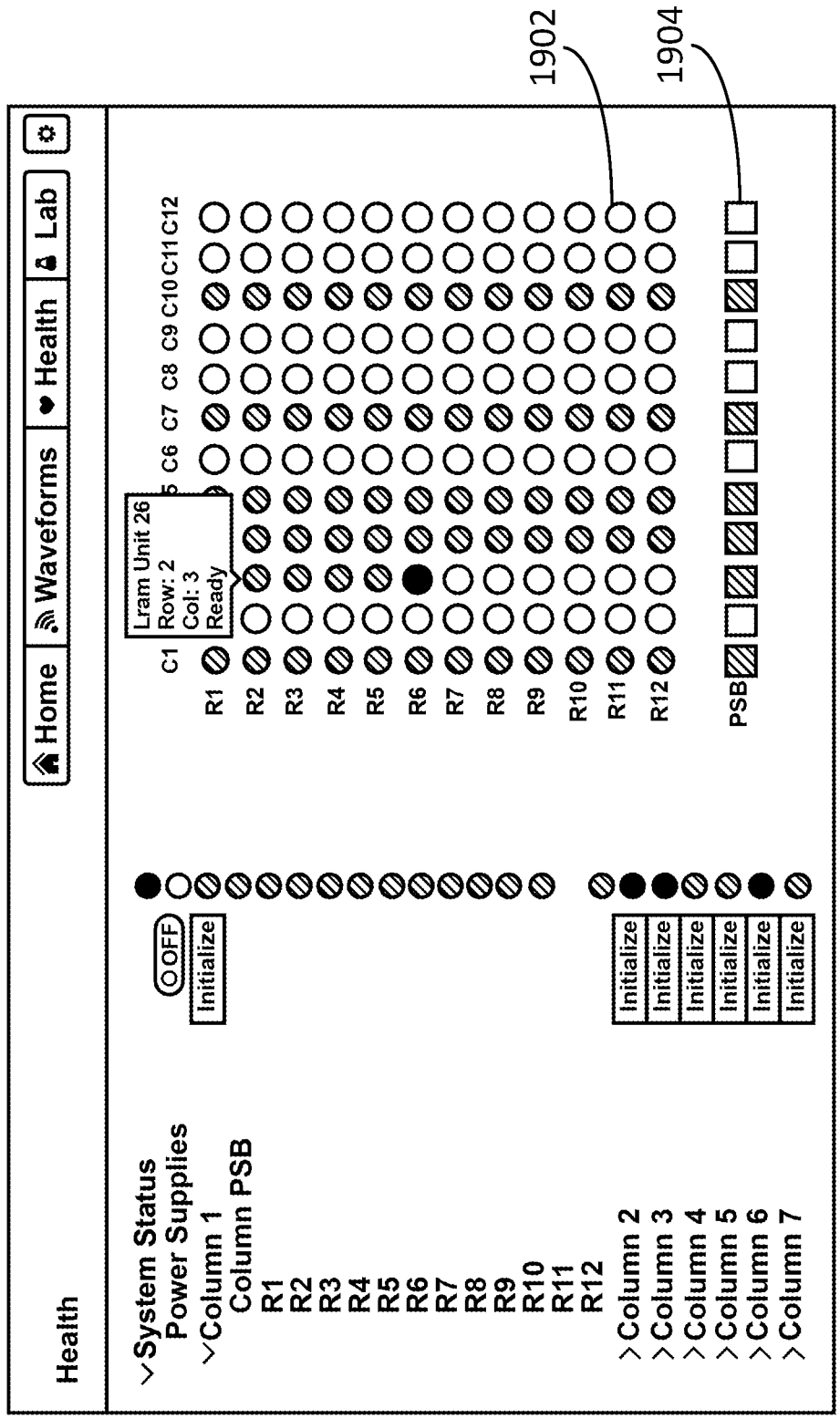
FIG. 19 illustrates an exemplary display showing the health of an amplifier system, in accordance with certain aspects of the present disclosure.

FIG. 19 illustrates an exemplary embodiment of a display showing the health of an amplifier system. The power management system 1040_1 can include instructions executed by electronic processing system 811 to render to display device (e.g., a computer/monitor) the state of the various amplifiers being controlled by the power management system 1040_1. The depicted example display shows the health of a system comprising, for instance, 144 amplifiers arranged in twelve columns and twelve rows. Each amplifier is represented by a circle 1902. A printed circuit board or power supply board is associated with each column, as represented by a square 1904. Indicia can be provided to characterize the operational state of each element. For example, a down arrow or color red may represent a failed state. Side arrows or amber color may represent a state transition. An up arrow or color green may represent a healthy state. Absent indicia may represent an off state. This can provide a graphical display useful for maintaining amplifier health in a number of ways as disclosed herein. For example, as discussed above, the power management system 1040_1 may enforce a limit on the bias voltage, drain current, duration of time the amplifier is turned on, and the state of voltages, currents, being within (or beyond) limits, or malfunctions, can be displayed. It is understood that the particular numbers of elements of the display can vary with the particulars of a given amplifier system, such as if there are more or fewer amplifiers, or if they are arranged in a different physical array.

Figure 20:
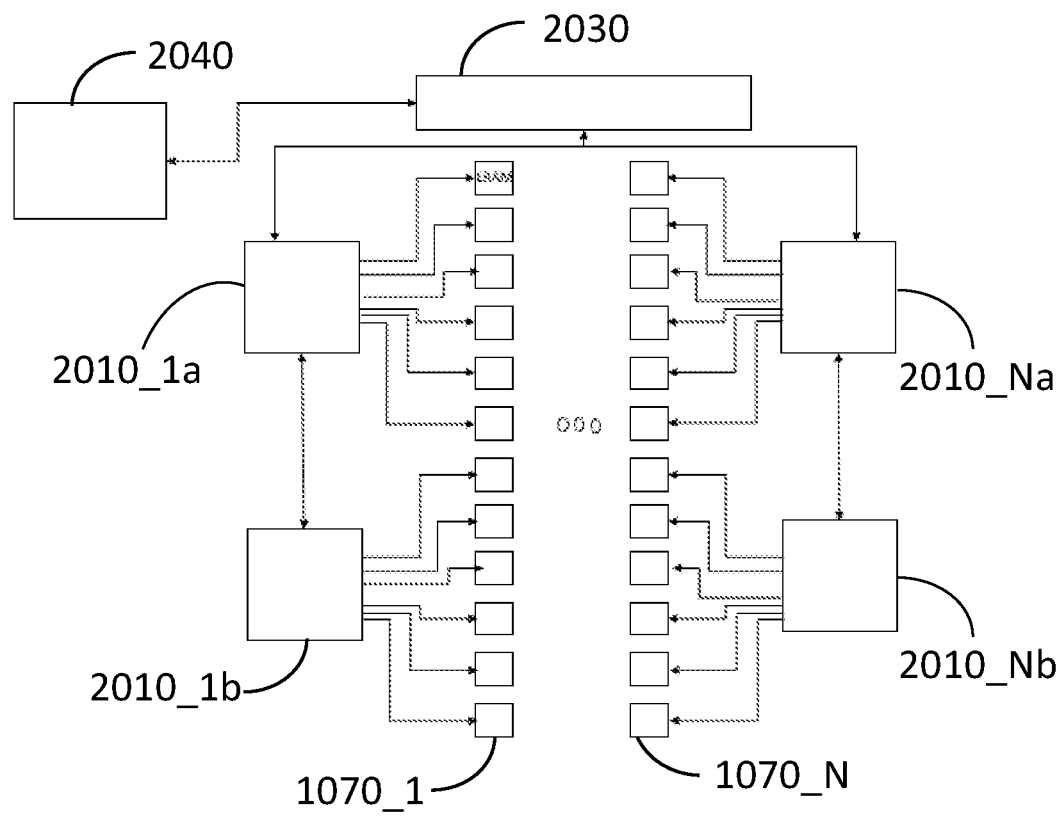
FIG. 20 illustrates an exemplary block diagram depicting a computer architecture for providing distributed IP addresses to amplifier modules, in accordance with certain aspects of the present disclosure.

FIG. 20 illustrates an exemplary block diagram depicting a computer architecture for providing distributed IP addresses to amplifier modules in an arrayed system, such as, for example, the system 100 depicted in FIG. 1, the system depicted in FIG. 9 and/or the system depicted in FIG. 10. In some embodiments, each amplifier module (e.g., amplifier chain 1070_1, amplifier modules 170, modular power amplifier 800) can be manufactured to be similar to every other amplifier module such that they are easily replaceable. Barring differences in components due to manufacturing/assembly, it may be preferable to not have the amplifier modules unique in either hardware terms or software terms. However, in many applications, such as, for example, a phased array system, to perform beam steering, the operating conditions of the various amplifiers in an amplifier module can be different depending on the physical position of a particular amplifier module in the array. For example, the amount of gain provided by the amplifiers in the leftmost amplifier module in the array can be different from the amount of gain provided by the amplifiers in LRAMs in the central portions of the array and/or the rightmost amplifier module. Accordingly, some disclosed embodiments are configured to allow each amplifier module to determine (or allow a connected computer system to determine) what gain the various amplifiers in that amplifier module should provide and accordingly what bias voltages should be provided.

In other systems, there can be hardware pins that would indicate the position (e.g., a digital address) of the amplifier module in the array which in turn would determine bias voltages that should be provided to the various amplifiers in that amplifier based on its position in the array. For example, each hardware pin would provide a digital address to the amplifier module so that they can be addressed.

In various embodiments of arrayed systems disclosed herein, the amplifier modules can be arranged in a plurality of rows and columns. The number of rows and columns can vary between 1 and 20 in some implementations. The number of rows can be different from the number of columns. An example implementation of an arrayed system comprising a plurality of rows and a plurality of columns is shown in FIG. 20. The arrayed system comprises a signal generator 2040, a central switch 2030, and a plurality of column switches 2010_1*a*, 2010_1*b*, . . . , 2010_Na, 2010_Nb. In the illustrated implementation, each column has two column switches that are connected to 6 different amplifier modules. The two switches associated with each column are connected to each other. In other implementations, there can be only 1 switch per column, but in general there can be any number of column switches. The column switches can be connected to a central switch 2030 which can be in communication with the signal generator 2040 (which may be, e.g., RF generator 1050).

In certain embodiments, the column switches and the central switch can be ethernet switches. Ports of the column switch can be configured as a virtual local area network (VLAN). In various implementations, each port of the column switch can be assigned its own subnet. Any device that plugs into a port of the column can thus be on its own network and need not be in communication with their neighbors. A Dynamic Host Configuration Protocol (DHCP) server within the central switch 2030 and/or the signal generator 2040 and/or column switch 2010 can have a complete listing of the network address for each port. When an amplifier module gets plugged in to a port of a column, a message requesting an IP address and providing the port's subnet address is sent over the network. The message can be sent by the amplifier module or a network element connected to the port which detects the presence of the amplifier module. The signal generator 2040 and/or the central switch 2030 and/or column switch 2010 can determine which subnet the request originated from and can assign a unique IP address to that amplifier module. This address can be unique to the port of the column switch and not to the amplifier module. For example, an amplifier module plugged in column 1: row 1 can be given the address 10.1.1.254, an amplifier module plugged in column 1: row 6 can be given the address 10.1.6.254, an amplifier module plugged in column 2: row 12 can be given the address 10.2.12.254, and an amplifier module plugged in column 12: row 12 can be given the address 10.12.12.254. If the amplifier modules in column 1: row 1 and column 12: row 12 are swapped, then each of those would get new addresses based on the new ports they are plugged in to. Thus, each amplifier module can be dynamically addressed based on its location without reconfiguring hardware or software.

In some embodiments, as shown in FIG. 20, a column switch can be connected to half of the modular power amplifiers in a column of the array of ports, where the software causes routing assignment of the IP address through the column switch. In some embodiments, the software can assign a subnet address to a column switch. The assigning of the IP address to the modular power amplifier can accordingly be based on the modular power amplifier specifying the subnet address and the column position.

This addressing scheme is easily scalable without requiring any hardware in the amplifier module harness or any special software to read the address during bootup as would be required when hardware pins are used to address an individual amplifier module. Thus, the disclosed embodiments can simplify the start-up procedures and reduce the amount of time required to start-up and/or replace an amplifier module.

Beyond applications in the RF generation field, the disclosed distributed addressing scheme can be used in a variety of other technologies such as in hardware/optical switches, routers, or other distributed systems in which there are replacements elements whose output depends on the position in the system. Furthermore, the disclosed embodiments of any of the address as described above can be combined with the current/voltage sensing capabilities described with other embodiments herein.

This way, the present disclosure contemplates combining any of the disclosed embodiments to provide a system with numerous technical advantages over conventional systems.

In the following, further features, characteristics, and exemplary technical solutions of the present disclosure will be described in terms of items that may be optionally claimed in any combination:

Item 1: A system comprising a modular power amplifier comprising a power amplifier subsystem comprising a first 90 degree hybrid block configured to receive an RF signal and output a split RF signal with components having a 90 degree phase shift; a second 90 degree hybrid block configured to receive and combine the split RF signal by removing the 90 degree phase shift; and a high-power amplifier configured to amplify at least one of the components of the split RF signal; a power distribution module configured to regulate an amount of power input to the high-power amplifier; and a power sequencer configured to control the timing of power delivery by the power distribution module.

Item 2: The system of any one of the preceding items, the first 90 degree hybrid block further comprising a resistor configured to dissipate at least a portion of RF power going through the first 90 degree hybrid block when the RF power is above a threshold.

Item 3: The system of any one of the preceding items, comprising a plurality of power amplifier subsystems, each of the power amplifier subsystems including the first hybrid block and the second hybrid block, where at least one of the plurality of the power amplifier subsystems replaces a high-power amplifier in another of the plurality of power amplifier subsystems to form a scaled power amplifier assembly.

Item 4: The system of any one of the preceding items, wherein the plurality of power amplifier subsystems includes at least four power amplifier subsystems to form the scaled power amplifier assembly.

Item 5: The system of any one of the preceding items, further comprising: a power divider coupled to a plurality of the modular power amplifiers arranged in parallel and configured to receive and amplify respective RF signals from the power divider; and a high-power combiner assembly coupled to the plurality of the modular power amplifiers and configured to combine respective RF output signals from the plurality of the modular power amplifiers.

Item 6: The system of any one of the preceding items, further comprising waveform generation circuitry comprising: a field-programmable gate array and a digital-to-analog converter, together configured to receive digital commands and a clock synchronization signal and to output the RF signal to the power amplifier subsystem; and a phase lock loop circuit configured to provide clocking to the power amplifier synchronized with the clock synchronization signal.

Item 7: The system of any one of the preceding items, wherein the digital-to-analog converter is configured to output an intermediate frequency of the RF signal, and the system further comprising: a mixer subsystem configured to upconvert the RF signal from the intermediate frequency to a final frequency going into the power amplifier subsystem.

Item 8: The system of any one of the preceding items, further comprising waveform generation circuitry comprising: a direct digital synthesizer chip configured to receive digital commands and a clock synchronization signal and to output the RF signal to the power amplifier subsystem; and a phase lock loop circuit configured to provide clocking to the power amplifier synchronized with the clock synchronization signal.

Item 9: A system comprising: a power amplifier subsystem comprising: a splitter configured to split an RF signal into a first RF component and a second RF component; a first high-power amplifier configured to amplify and output the first RF component; and a second high-power amplifier configured to amplify and output the second RF component; and a differential antenna having a first input operatively connected to the first high-power amplifier to receive the first RF component and a second input operatively connected to the second high-power amplifier to receive the second RF component.

Item 10: The system of any one of the preceding items, wherein the differential antenna is a high-impedance low-profile aperture.

Item 11: The system of any one of the preceding items, further comprising a connected dipole array or a long-slot array antenna, either including a plurality of the high-impedance low-profile apertures.

Item 12: A system comprising: a modular power amplifier having two power amplifier subsystems, each comprising: a first 90 degree hybrid block configured to receive an RF signal and output a split RF signal with components having a 90 degree phase shift; a high-power amplifier configured to amplify at least one of the components of the split RF signal; and a second 90 degree hybrid block configured to receive, combine, and output the split RF signal by removing the 90 degree phase shift; and a differential antenna configured to receive the output of the second 90 degree hybrid blocks of the two power amplifier subsystems.

Item 13: A three-dimensional power amplifier comprising: a first high-power amplifier configured to receive a first RF signal and output a first amplified RF signal; and a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

Item 14: The three-dimensional power amplifier of any one of the preceding items, wherein the first high-power amplifier and the second high-power amplifier are of generally planar construction and the generally planar amplifiers have the different orientations.

Item 15: The three-dimensional power amplifier of any one of the preceding items, wherein the first high-power amplifier and the second high-power amplifier are constructed on printed circuit boards and disposed to have the different orientations.

Item 16: The three-dimensional power amplifier of any one of the preceding items, wherein the different orientations have an angle of 90 degrees between them to form a portion of a square distribution of high-power amplifiers.

Item 17: The three-dimensional power amplifier of any one of the preceding items, wherein the different orientations have an angle of 120 degrees between them to form a portion of a hexagonal distribution of high-power amplifiers.

Item 18: The three-dimensional power amplifier of any one of the preceding items, wherein the different orientations have an angle of 60 degrees between them to form a portion of a triangular distribution of high-power amplifiers.

Item 19: The three-dimensional power amplifier of any one of the preceding items, further comprising a third high-power amplifier having an orientation substantially perpendicular to the first high-power amplifier and a fourth high-power amplifier having an orientation substantially perpendicular to the second high-power amplifier.

Item 20: The three-dimensional power amplifier of any one of the preceding items, further comprising a cooling component located between the first high-power amplifier and the second high-power amplifier.

Item 21: The three-dimensional power amplifier of any one of the preceding items, further comprising electromagnetic shielding adjacent the first high-power amplifier or the second high-power amplifier.

Item 22: The three-dimensional power amplifier of any one of the preceding items, wherein the first high-power amplifier and the second high-power amplifier are configured to receive the first RF signal and the second RF signal, both signals having a wavelength, and the first high-power amplifier and the second high-power amplifier are separated by at least approximately half of the wavelength.

Item 23: A system comprising: an RF generator configured to generate RF signals having a wavelength; a plurality of amplifiers configured to receive and amplify the RF signals from the RF generator and that are separated from each other by a separation distance in a range between approximately 0.3 times the wavelength and approximately 0.7 times the wavelength; and a power management system configured to control one or more of the plurality of amplifiers based on information received that is associated with the RF signals.

Item 24: The system as in any one of the preceding items, wherein the separation between the plurality of amplifiers is at least approximately 0.7 times the wavelength.

Item 24: The system as in any one of the preceding items, wherein the separation between the plurality of amplifiers is at least approximately 0.3 times the wavelength or at least approximately 0.5 times the wavelength.

Item 25: The system as in any one of the preceding items, wherein the wavelength is within the L-band.

Item 26: The system as in any one of the preceding items, wherein the separation between the plurality of amplifiers is between approximately 3-7 inches.

Item 27: The system as in any one of the preceding items, wherein the RF generator is configured to generate a plurality of wavelengths of RF signals and the separation between the plurality of amplifiers is approximately the smallest wavelength of the plurality of wavelengths.

Item 28: The system as in any one of the preceding items, wherein the power management system is configured to automatically determine voltages and/or currents required to turn-on and/or turn-off corresponding amplifiers in the plurality of amplifiers.

Item 29: The system as in any one of the preceding items, wherein the power management system is configured to perform the automatic determination prior to the RF generator generating the RF signals.

Item 30: The system as in any one of the preceding items, wherein the power management system is configured to access computer memory to obtain historical data stored from prior operations of the system, wherein the automatic determination is based at least partially on the historical data.

Item 31: The system as in any one of the preceding items, wherein the power management system is further configured to: detect whether the RF signal to be amplified is turned on or off; and generate a gate voltage or a gate current sufficient to turn on an amplifier responsive to detecting that the RF signal is turned on and turn off the amplifier responsive to detecting that the RF signal is turned off.

Item 32: The system as in any one of the preceding items, wherein the power management system is configured to generate the gate voltage or gate current at a rate between 10 MHz and 100 MHz.

Item 33: The system as in any one of the preceding items, wherein the power management system is configured to generate the gate voltage or gate current at a rate between 1 kHz and 500 MHz.

Item 34: The system as in any one of the preceding items, wherein the power management system is further configured to: receive a trigger from the RF generator that the RF signal will be turned on; and initiate a power sequencing process comprising obtaining, from a computer memory, voltages and/or currents for biasing the amplifier prior to arrival of the RF signal.

Item 35: The system as in any one of the preceding items, wherein the system does not include a cooling system.

Item 36: The system as in any one of the preceding items, the plurality of amplifiers comprising: a first high-power amplifier configured to receive a first RF signal and output a first amplified RF signal; and a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

Item 37: The system as in any one of the preceding items, wherein the first high-power amplifier and the second high-power amplifier are of generally planar construction and the generally planar amplifiers have the different orientations.

Item 38: The system as in any one of the preceding items, wherein the first high-power amplifier and the second high-power amplifier are constructed on printed circuit boards and disposed to have the different orientations.

Item 39: The system as in any one of the preceding items, wherein the different orientations have an angle of 90 degrees between them to form a portion of a square distribution of high-power amplifiers.

Item 40: The system as in any one of the preceding items, wherein the different orientations have an angle of 120 degrees between them to form a portion of a hexagonal distribution of high-power amplifiers.

Item 41: The system as in any one of the preceding items, wherein the different orientations have an angle of 60 degrees between them to form a portion of a triangular distribution of high-power amplifiers.

Item 42: The system as in any one of the preceding items, further comprising a third high-power amplifier having an orientation substantially perpendicular to the first high-power amplifier and a fourth high-power amplifier having an orientation substantially perpendicular to the second high-power amplifier.

Item 43: The system as in any one of the preceding items, further comprising a cooling component located between the first high-power amplifier and the second high-power amplifier.

Item 44: The system as in any one of the preceding items, further comprising electromagnetic shielding adjacent the first high-power amplifier or the second high-power amplifier.

Item 45: The system as in any one of the preceding items, further comprising a non-transitory, machine-readable medium storing instructions which, when executed by at least one programmable processor, cause operations comprising: transmitting, from an amplifier of the plurality of amplifiers, a request for an IP address; transmitting, from the amplifier, a subnet address of the amplifier based on a port that the amplifier is connected to; and assigning, by an address server, an IP address to the amplifier based on the subnet address of the amplifier.

Item 46: A system comprising: an RF generator configured to generate RF signals having a wavelength; a plurality of amplifiers configured to receive and amplify the RF signals from the RF generator and that are separated from each other by at least approximately half of the wavelength; a sensor configured to detect at least one sensed characteristic associated with at least one amplifier of the plurality of amplifiers; and a power management system configured to control one or more of the plurality of amplifiers based on the sensed characteristic.

Item 47: The system as in any one of the preceding items, wherein the separation between the plurality of amplifiers is at least approximately 0.7 times the wavelength.

Item 48: The system as in any one of the preceding items, wherein the separation between the plurality of amplifiers is at least approximately 0.3 times the wavelength.

Item 49: The system as in any one of the preceding items, wherein the wavelength is within the L-band.

Item 50: The system as in any one of the preceding items, wherein the separation between the plurality of amplifiers is approximately 5 inches.

Item 51: The system as in any one of the preceding items, wherein the RF generator is configured to generate a plurality of wavelengths of RF signals and the separation between the plurality of amplifiers is approximately the smallest wavelength of the plurality of wavelengths.

Item 52: The system as in any one of the preceding items, wherein the power management system is configured to automatically determine voltages and/or currents required to turn-on and/or turn-off corresponding amplifiers in the plurality of amplifiers.

Item 53: The system as in any one of the preceding items, wherein the power management system is configured to perform the automatic determination prior to the RF generator generating the RF signals.

Item 54: The system as in any one of the preceding items, wherein the power management system is configured to access computer memory to obtain historical data stored from prior operations of the system, wherein the automatic determination is based at least partially on the historical data.

Item 55: The system as in any one of the preceding items, wherein the power management system is further configured to modify a bias voltage or a bias current of one or more of the plurality of amplifiers.

Item 56: The system as in any one of the preceding items, the plurality of amplifiers comprising: a first high-power amplifier configured to receive a first RF signal and output a first amplified RF signal; and a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

Item 57: The system as in any one of the preceding items, wherein the first high-power amplifier and the second high-power amplifier are of generally planar construction and the generally planar amplifiers have the different orientations.

Item 58: The system as in any one of the preceding items, wherein the first high-power amplifier and the second high-power amplifier are constructed on printed circuit boards and disposed to have the different orientations.

Item 59: The system as in any one of the preceding items, wherein the different orientations have an angle of 90 degrees between them to form a portion of a square distribution of high-power amplifiers.

Item 60: The system as in any one of the preceding items, wherein the different orientations have an angle of 120 degrees between them to form a portion of a hexagonal distribution of high-power amplifiers.

Item 61: The system as in any one of the preceding items, wherein the different orientations have an angle of 60 degrees between them to form a portion of a triangular distribution of high-power amplifiers.

Item 62: The system as in any one of the preceding items, further comprising a third high-power amplifier having an orientation substantially perpendicular to the first high-power amplifier and a fourth high-power amplifier having an orientation substantially perpendicular to the second high-power amplifier.

Item 63: The system as in any one of the preceding items, further comprising a cooling component located between the first high-power amplifier and the second high-power amplifier.

Item 64: The system as in any one of the preceding items, further comprising electromagnetic shielding adjacent the first high-power amplifier or the second high-power amplifier.

Item 65: The system as in any one of the preceding items, wherein the sensor is a current sensor.

Item 66: The system as in any one of the preceding items, wherein the current sensor is a drain current sensor that monitors a drain current of one or more of the plurality of amplifiers.

Item 67: The system as in any one of the preceding items, wherein the current sensor is a gate current sensor that monitors a gate current of one or more of the plurality of amplifiers.

Item 68: The system as in any one of the preceding items, wherein the system is configured to: compare a sensed current value obtained from the drain current sensor to a threshold value; and identify an amplifier error state of one or more of the plurality of amplifiers.

Item 69: The system as in any one of the preceding items, wherein the system is further configured to: determine an amount by which a voltage or a current provided to one or more of the plurality of amplifiers should be offset based on the amplifier error state; and apply the offset to one or more of the plurality of amplifiers.

Item 70: The system as in any one of the preceding items, wherein the power management system is further configured to modify a drain voltage or a drain current at a drain terminal of one or more of the plurality of amplifiers.

Item 71: The system as in any one of the preceding items, wherein the power management system is further configured to turn off one or more of the plurality of amplifiers responsive to the sensed characteristic being above a limit.

Item 72: The system as in any one of the preceding items, wherein the sensed characteristic is a temperature.

Item 73: The system as in any one of the preceding items, wherein the sensor is a current sensor and the power management system is further configured to determine a temperature based on a drain current of one or more of the plurality of amplifiers as detected with the current sensor.

Item 74: The system as in any one of the preceding items, wherein the power management system is further configured to adjust a bias voltage or a bias current based on the detected drain current to improve an operational characteristic of one or more of the plurality of amplifiers.

Item 75: The system as in any one of the preceding items, wherein the sensor is a temperature sensor configured to sense an ambient temperature in the vicinity of one or more of the plurality of amplifiers.

Item 76: The system as in any one of the preceding items, wherein the power management system is further configured to: determine, at least intermittently, the temperature of one or more of the plurality of amplifiers; and adjust a bias voltage or a bias current of one or more of the plurality of amplifiers based on the determined temperature to improve an operational characteristic of one or more of the plurality of amplifiers.

Item 77: The system as in any one of the preceding items, wherein the sensor is a current sensor and the power management system is further configured to determine a temperature based on a gate current of one or more of the plurality of amplifiers as detected with the current sensor.

Item 78: The system as in any one of the preceding items, wherein the power management system is further configured to adjust a bias voltage or a bias current based on the detected gate current to improve an operational characteristic of one or more of the plurality of amplifiers.

Item 79: The system as in any one of the preceding items, wherein the power management system is further configured to: turn on or off one or more of the plurality of amplifiers based on a presence or absence of the RF signals to be amplified; and adjust a bias voltage or current based on a drain current as sensed with the sensor.

Item 80: The system as in any one of the preceding items, wherein the power management system is further configured to perform operations comprising: monitoring a drain and/or gate current with the sensor; determining that the drain current and/or gate current is outside a current range that is based on a gate voltage of one or more of the plurality of amplifiers; determining a gate voltage that causes the drain and/or gate current to be within the current range; and providing the gate voltage to one or more of the plurality of amplifiers to improve the operation of one or more of the plurality of amplifiers.

Item 81: The system as in any one of the preceding items, further comprising: a display device; at least one programmable processor; and a non-transitory machine-readable medium storing instructions which, when executed by the at least one programmable processor, cause the at least one programmable processor to perform operations comprising: determining operational states of the plurality of amplifiers based at least on the at least one sensed characteristic; and displaying, at the display device, indicia characterizing the operational states of the plurality of amplifiers.

Item 82: The system as in any one of the preceding items, further comprising a non-transitory, machine-readable medium storing instructions which, when executed by at least one programmable processor, cause operations comprising: transmitting, from an amplifier of the plurality of amplifiers, a request for an IP address; transmitting, from the amplifier, a subnet address of the amplifier based on a port that the amplifier is connected to; and assigning, by an address server, an IP address to the amplifier based on the subnet address of the amplifier.

Item 83: A computer program product comprising a non-transitory, machine-readable medium storing instructions which, when executed by at least one programmable processor, cause operations comprising: transmitting, from a modular component, a request for an IP address; transmitting, from the modular component, a subnet address of the modular component based on a port that the modular component is connected to; and assigning, by an address server, an IP address to the modular component based on the subnet address of the modular component.

Item 84: The computer program product as in any one of the preceding items, wherein the modular component is a modular power amplifier configured to amplify an RF signal.

Item 85: The computer program product as in any one of the preceding items, the operations further comprising providing a bias voltage to the modular power amplifier based on the IP address.

Item 86: The computer program product as in any one of the preceding items, wherein the address server is a Radio Frequency System-on-Chip (RFSoC).

Item 87: The computer program product as in any one of the preceding items, wherein the assigning of the IP address is based on a row and a column of the port in an array of ports configured to connect to modular power amplifiers.

Item 88: The computer program product as in any one of the preceding items, wherein the IP address is assigned further based on a column switch that a modular power amplifier is connected to and based on a column position of the modular power amplifier as connected to the column switch, wherein the column switch connects a plurality of modular power amplifiers connected to the array of ports.

Item 89: The computer program product as in any one of the preceding items, wherein the column switch is connected to all modular power amplifiers in a column of the array of ports, the operations further comprising routing assignment of the IP address through the column switch.

Item 90: The computer program product as in any one of the preceding items, wherein the column switch is connected to half of the modular power amplifiers in a column of the array of ports, the operations further comprising routing assignment of the IP address through the column switch.

Item 91: The computer program product as in any one of the preceding items, the operations further comprising assigning, to the column switch, the subnet address, and wherein the assigning of the IP address to the modular power amplifier is based on the modular power amplifier specifying the subnet address and the column position.

Item 92: The computer program product as in any one of the preceding items, the operations further comprising raising and/or lowering the gate voltage of the modular power amplifier to synchronize gating the modular power amplifier with an incoming RF signal.

Item 93: The computer program product as in any one of the preceding items, the operations further comprising measuring a characteristic of the modular power amplifier and adjusting a gate bias voltage of the modular power amplifier.

Item 94: The computer program product as in any one of the preceding items, wherein the characteristic is a temperature of the modular power amplifier, and the operations further comprising adjusting the gate bias voltage to maintain the temperature to be approximately a threshold temperature.

Item 95: The computer program product as in any one of the preceding items, wherein the characteristic is a linearity measure of the modular power amplifier, and the operations further comprising adjusting the gate bias voltage to maintain the linearity measure to be approximately a predetermined linearity measure.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "machine-readable medium" (or "computer readable medium") refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" (or "computer readable signal") refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively or additionally store such machine instructions in a transient manner, such as for example as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive trackpads, voice recognition hardware and software, optical scanners, optical pointers, digital image capture devices and associated interpretation software, and the like.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The subject matter described herein can be embodied in systems, apparatus, methods, computer programs and/or articles depending on the desired configuration. Any methods or the logic flows depicted in the accompanying figures and/or described herein do not necessarily require the particular order shown, or sequential order, to achieve desirable results. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. The implementations described above can be directed to various combinations and subcombinations of the disclosed features and/or combinations and subcombinations of further features noted above. Furthermore, above described advantages are not intended to limit the application of any issued claims to processes and structures accomplishing any or all of the advantages.

Additionally, section headings shall not limit or characterize the invention(s) set out in any claims that may issue from this disclosure. Further, the description of a technology in the "Background" is not to be construed as an admission that technology is prior art to any invention(s) in this disclosure. Neither is the "Summary" to be considered as a characterization of the invention(s) set forth in issued claims. Furthermore, any reference to this disclosure in general or use of the word "invention" in the singular is not intended to imply any limitation on the scope of the claims set forth below. Multiple inventions may be set forth according to the limitations of the multiple claims issuing from this disclosure, and such claims accordingly define the invention(s), and their equivalents, that are protected thereby.

What is claimed is:

1. A system comprising:
   an RF generator configured to generate RF signals having a wavelength;
   a plurality of amplifiers configured to receive and amplify the RF signals from the RF generator, the plurality of amplifiers connected to an antenna array including antennas that are separated from each other by a separation distance in a range between about 0.2 times the wavelength and about 10.0 times the wavelength; and
   a power management system configured to:
      control one or more of the plurality of amplifiers based on information received that is associated with the RF signals; and
      automatically determine at least one of voltages or currents required to at least one of turn on or turn off corresponding amplifiers in the plurality of amplifiers prior to the RF generator generating the RF signals.

2. The system of claim 1, wherein the separation distance is at least approximately 0.5 times the wavelength.

3. The system of claim 1, wherein the separation distance is at least approximately 0.3 times the wavelength.

4. The system of claim 1, wherein the wavelength is within the L-band.

5. The system of claim 4, wherein the separation distance is between approximately 3-7 inches.

6. The system of claim 1, wherein the RF generator is configured to generate a plurality of wavelengths of RF signals and the separation distance is approximately the smallest wavelength of the plurality of wavelengths.

7. The system of claim 1, wherein the power management system is configured to access computer memory to obtain historical data stored from prior operations of the system, wherein the automatic determination is based at least partially on the historical data.

8. The system of claim 1, wherein the power management system is further configured to:
   detect whether an RF signal to be amplified is turned on or off; and
   generate a gate voltage or a gate current sufficient to turn on an amplifier responsive to detecting that the RF signal is turned on and turn off the amplifier responsive to detecting that the RF signal is turned off.

9. The system of claim 8, wherein the power management system is configured to generate the gate voltage or gate current at a rate between 10 MHz and 100 MHz.

10. The system of claim 8, wherein the power management system is configured to generate the gate voltage or gate current at a rate between 1 kHz and 500 MHz.

11. The system of claim 1, wherein the power management system is further configured to:
    receive a trigger from the RF generator that an RF signal will be turned on; and
    initiate a power sequencing process comprising obtaining, from a computer memory, at least one of voltages or currents for biasing the amplifier prior to arrival of the RF signal.

12. The system of claim 1, wherein the system does not include a cooling system.

13. The system of claim 1, the plurality of amplifiers comprising:
    a first high-power amplifier configured to receive a first RF signal and output a first amplified RF signal; and
    a second high-power amplifier configured to receive a second RF signal and output a second amplified RF signal, the second high-power amplifier having a different orientation than the first high-power amplifier, the different orientations causing a reduction in electromagnetic interference between the first high-power amplifier and the second high-power amplifier.

14. The system of claim 13, wherein the first high-power amplifier and the second high-power amplifier are of generally planar construction and have the different orientations.

15. The system of claim 13, wherein the first high-power amplifier and the second high-power amplifier are constructed on printed circuit boards and disposed to have the different orientations.

16. The system of claim 13, wherein the different orientations have an angle of 90 degrees between them to form a portion of a square distribution of high-power amplifiers.

17. The system of claim 13, wherein the different orientations have an angle of 120 degrees between them to form a portion of a hexagonal distribution of high-power amplifiers.

18. The system of claim 13, wherein the different orientations have an angle of 60 degrees between them to form a portion of a triangular distribution of high-power amplifiers.

19. The system of claim 16, further comprising a third high-power amplifier having an orientation substantially perpendicular to the first high-power amplifier and a fourth high-power amplifier having an orientation substantially perpendicular to the second high-power amplifier.

20. The system of claim 13, further comprising a cooling component located between the first high-power amplifier and the second high-power amplifier.

21. The system of claim 13, further comprising electromagnetic shielding adjacent the first high-power amplifier or the second high-power amplifier.

22. The system of claim 1, further comprising a non-transitory, machine-readable medium storing instructions which, when executed by at least one programmable processor, cause the at least one programmable processor to:
in response to detecting presence from an amplifier of the plurality of amplifiers:
transmit a request for an IP address;
transmit a subnet address of a port connected to the amplifier; and
assign the IP address to the amplifier based on the subnet address of the port connected to the amplifier.

* * * * *